(12) United States Patent  
Kutsukake et al.

(10) Patent No.: US 8,994,121 B2
(45) Date of Patent: Mar. 31, 2015

(54) NONVOLATILE SEMICONDUCTOR MEMORY DEVICE

(71) Applicant: Kabushiki Kaisha Toshiba, Minato-ku (JP)

(72) Inventors: Hiroyuki Kutsukake, Yokohama (JP); Masato Endo, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/947,536

(22) Filed: Jul. 22, 2013

(65) Prior Publication Data

US 2014/0284713 A1    Sep. 25, 2014

Related U.S. Application Data

(60) Provisional application No. 61/804,291, filed on Mar. 22, 2013.

(51) Int. Cl.
*H01L 27/088* (2006.01)
*H01L 27/115* (2006.01)
*G11C 16/30* (2006.01)

(52) U.S. Cl.
CPC .......... *H01L 27/11529* (2013.01); *G11C 16/30* (2013.01)
USPC .... 257/401; 257/392; 257/393; 257/E21.456; 365/185.17; 365/185.23

(58) Field of Classification Search
CPC ............... H01L 29/4232; H01L 29/66484; H01L 21/82385; H01L 29/7856
USPC ............. 257/183.1, 215, 288, 335, 391, 392, 257/393, 401, E21.456; 365/185.17, 185.23
See application file for complete search history.

(56) References Cited

U.S. PATENT DOCUMENTS

| 7,119,413 | B2 * | 10/2006 | Kutsukake et al. ........... 257/508 |
| 7,830,715 | B2 * | 11/2010 | Taniwaki et al. ........ 365/185.17 |
| 7,911,844 | B2 | 3/2011 | Nakamura et al. |
| 8,093,130 | B2 | 1/2012 | Kawakita |
| 2009/0050966 | A1 | 2/2009 | Takasu |

FOREIGN PATENT DOCUMENTS

| JP | 2006-222329 | 8/2006 |
| JP | 2008-187141 | 8/2008 |
| JP | 2009-49295 | 3/2009 |
| JP | 2009-152388 | 7/2009 |

* cited by examiner

*Primary Examiner* — Eduardo A Rodela
(74) *Attorney, Agent, or Firm* — Oblon, McClelland, Maier & Neustadt, L.L.P.

(57) ABSTRACT

A transfer transistor includes a pair of first diffusion regions and a gate electrode layer. The pair of first diffusion regions are formed in a surface of a semiconductor substrate, and are each connected to a contact. The gate electrode layer is formed on the semiconductor substrate via a gate insulating layer and has a pair of openings each surrounding the contact.

9 Claims, 22 Drawing Sheets

NONVOLATILE SEMICONDUCTOR MEMORY DEVICE

CROSS REFERENCE TO RELATED APPLICATIONS

This application is based on and claims the benefit of priority from prior U.S. Provisional Patent Application No. 61/804,291, filed on Mar. 22, 2013, the entire contents of which are incorporated herein by reference.

FIELD

Embodiments described herein relate to a nonvolatile semiconductor memory device.

BACKGROUND

Conventionally known is a NAND type flash memory that includes a memory string in which a plurality of memory cells are connected in series, each of the memory cells storing information in a nonvolatile manner. During the likes of a data write operation or a data erase operation in this NAND type flash memory, a voltage that is higher than a power supply voltage must be transferred to a control gate line. Thus, in order to transfer the high voltage, the NAND type flash memory has a row decoder circuit that includes a transfer transistor having a high withstand voltage.

On the other hand, in order to meet the demands for miniaturization and multi-leveling (MLC: multi-level cells) of the NAND type flash memory, peripheral circuits other than a cell array in the NAND type flash memory must be made small yet must also remain sufficiently capable of transferring a desired write potential.

DETAILED DESCRIPTION

A nonvolatile semiconductor memory device according to an embodiment described below includes a memory cell array and a transfer transistor. The memory cell array is configured as an arrangement of memory cells each holding data in a nonvolatile manner. The transfer transistor is configured to transfer a certain voltage to a gate of the memory cell. The transfer transistor includes a pair of first diffusion regions and a gate electrode layer. The pair of first diffusion regions are formed in a surface of a semiconductor substrate and are each connected to a contact. The gate electrode layer is formed on the semiconductor substrate via a gate insulating layer and has a pair of openings each surrounding the contact.

[First Embodiment]

Figure 1:
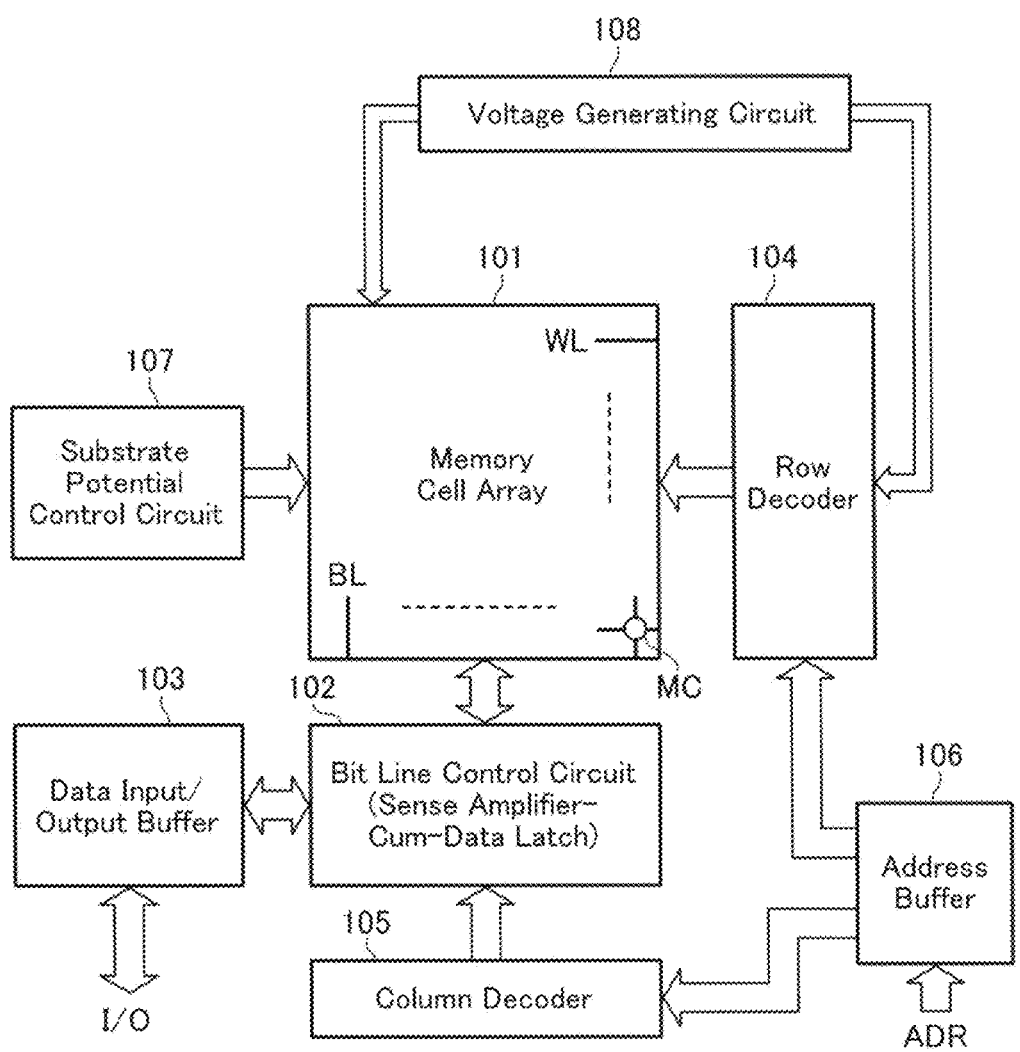
FIG. 1 is an example of a block diagram showing a schematic configuration of a NAND cell type flash memory according to a first embodiment.

FIG. 1 is a block diagram showing a schematic configuration of a nonvolatile semiconductor memory device (NAND type flash memory) according to a first embodiment. As shown in FIG. 1, the nonvolatile semiconductor memory device according to the first embodiment includes a memory cell array 101, a bit line control circuit 102, a data input/output buffer 103, a row decoder 104, a column decoder 105, an address buffer 106, a substrate potential control circuit 107, and a voltage generating circuit 108.

The memory cell array 101 includes a plurality of bit lines BL and a plurality of word lines WL. Moreover, the memory cell array 101 is configured having memory cells MC disposed in a matrix therein, each memory cell MC storing data. The memory cell MC is configured to be electrically data rewritable.

The bit line control circuit 102 performs latching of data for write or a sensing operation for reading a potential of the bit line BL, performs a sensing operation for a verify read after write, and, furthermore, performs a latching of rewrite data. The bit line control circuit 102 receives data via the data input/output buffer 103.

The row decoder 104 and the column decoder 105 receive an address signal via the address buffer 106. The row decoder 104 selects the word line WL based on the address signal, and the column decoder 105 selects the bit line BL based on the address signal.

The substrate potential control circuit 107 controls a potential of a P type semiconductor substrate where the memory cell MC is formed. The voltage generating circuit 108 generates a voltage required for the likes of write and read operations on the memory cell MC.

Figure 2:
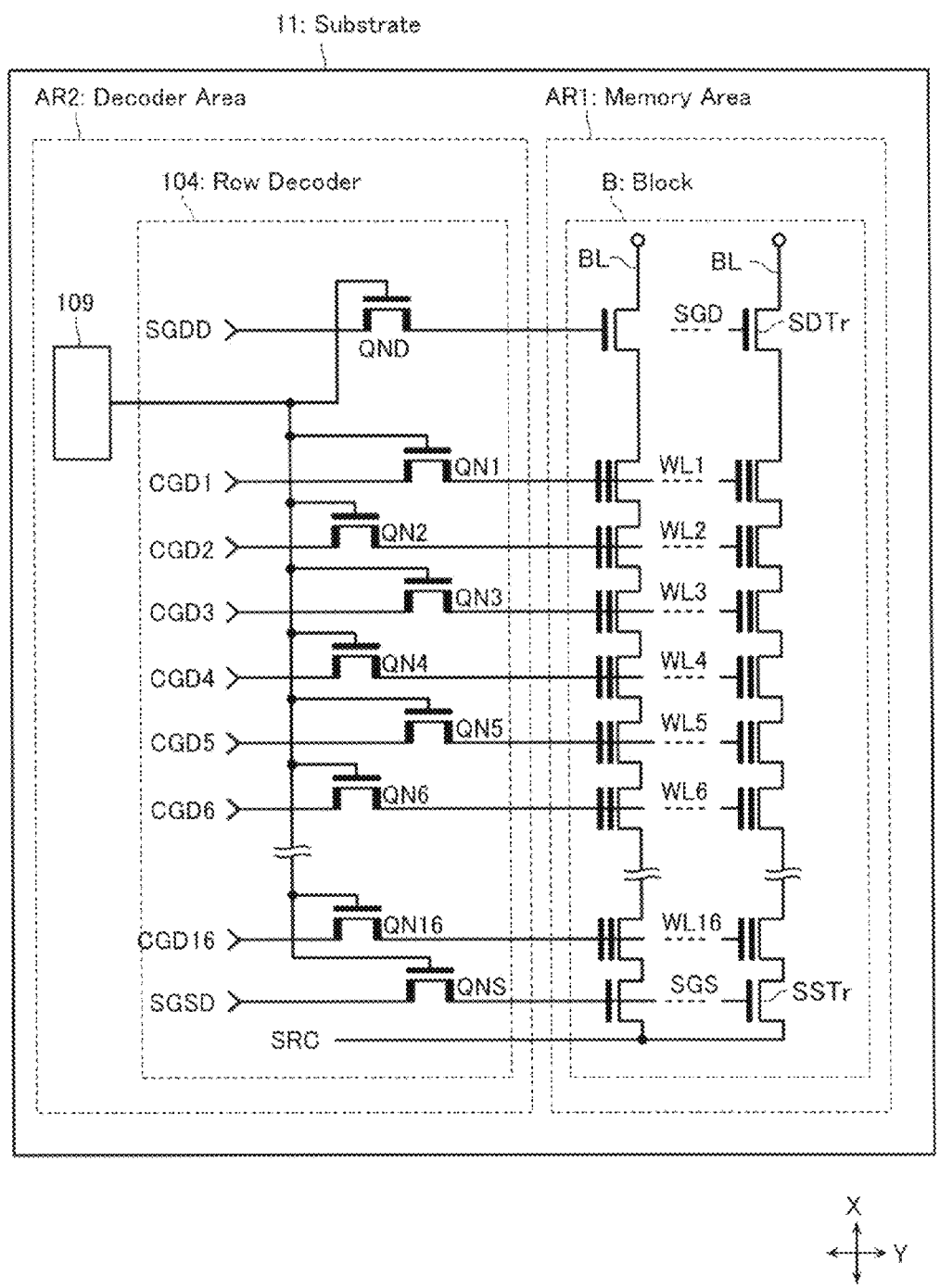
FIG. 2 is an example of a top view showing a memory area AR1 and a decoder area AR2 according to the first embodiment.

A memory area AR1 shown in FIG. 2 is an area where the memory cell array 101 is formed. Moreover, a decoder area AR2 shown in FIG. 2 is an area where the row decoder 104 is formed. As shown in FIG. 2, the memory area AR1 and the decoder area AR2 are both provided to a P type semiconductor substrate 11. Note that below, directions parallel to the P type semiconductor substrate 11 are assumed to be an X direction and a Y direction, and that, moreover, a direction perpendicular to the P type semiconductor substrate 11 is assumed to be a Z direction. The X direction, Y direction, and Z direction are orthogonal.

For convenience, FIG. 2 illustrates one block B only, but the memory cell array 101 is configured by a plurality of blocks B. In the memory cell array 101, data is erased an units of this block B (block erase processing). The block B includes a plurality of memory units. One memory unit is configured by: a memory string configured from, for example, 16 memory cells (EEPROM) connected in series; and a drain side select transistor SDTr and source side select transistor SSTr connected to the two ends of this memory string. One end of the drain side select transistor SDTr is connected to the bit line BL, and one end of the source side select transistor SSTr is connected to a source line SRC. Control gates of the memory cells disposed in a line in the Y direction are commonly connected to any one of word lines WL1~WL16. Moreover, control gates of the drain side select transistors SDTr disposed in a line in the Y direction are commonly connected to a drain side select gate line SGD, and control gates of the source side select transistors SSTr disposed in a line in the Y direction are commonly connected to a source side select gate line SGS.

In addition, FIG. 2 shows the case where the row decoder 104 is disposed to one side of one block B in the memory area AR1 (memory cell array 101). The row decoder 104 includes transfer transistors QN1~QN16, QND, and QNS connected to each of the word lines WL1~WL16 and the select gate lines SGD and SGS, respectively. For example, the transfer transistors QN1~QN16, QND, and QNS are enhancement type n type MOS transistors.

Connected between the word lines WL1~WL16 and their signal input nodes CGD1~CGD16 are current paths of the transfer transistors QN1~QN16, respectively. Moreover, connected between the drain side select gate line SGD and its signal input node SGDD is a current path of the transfer transistor QND. Furthermore, connected between the source side select gate line SGS and its signal input node SGSD is a current path of the transfer transistor QNS. In addition, a voltage switching circuit 109 is provided for setting a gate voltage of the transfer transistors QN1~QN16, QND, and QNS to switch a voltage of the word lines WL1~WL16 and the select gate lines SGD and SGS.

As mentioned previously, the row decoder 104 includes the transfer transistors QN1~QN16, QND, and QNS for transferring a high voltage, such as a write-dedicated high voltage (20 V or more), and so on, to the word lines WL and the select gate lines SOD and SGS. Transistors for transferring such a high voltage are provided not only to the row decoder 104, but also to, for example, the previously mentioned substrate potential control circuit 107 or the voltage switching circuit 109.

Figure 3:
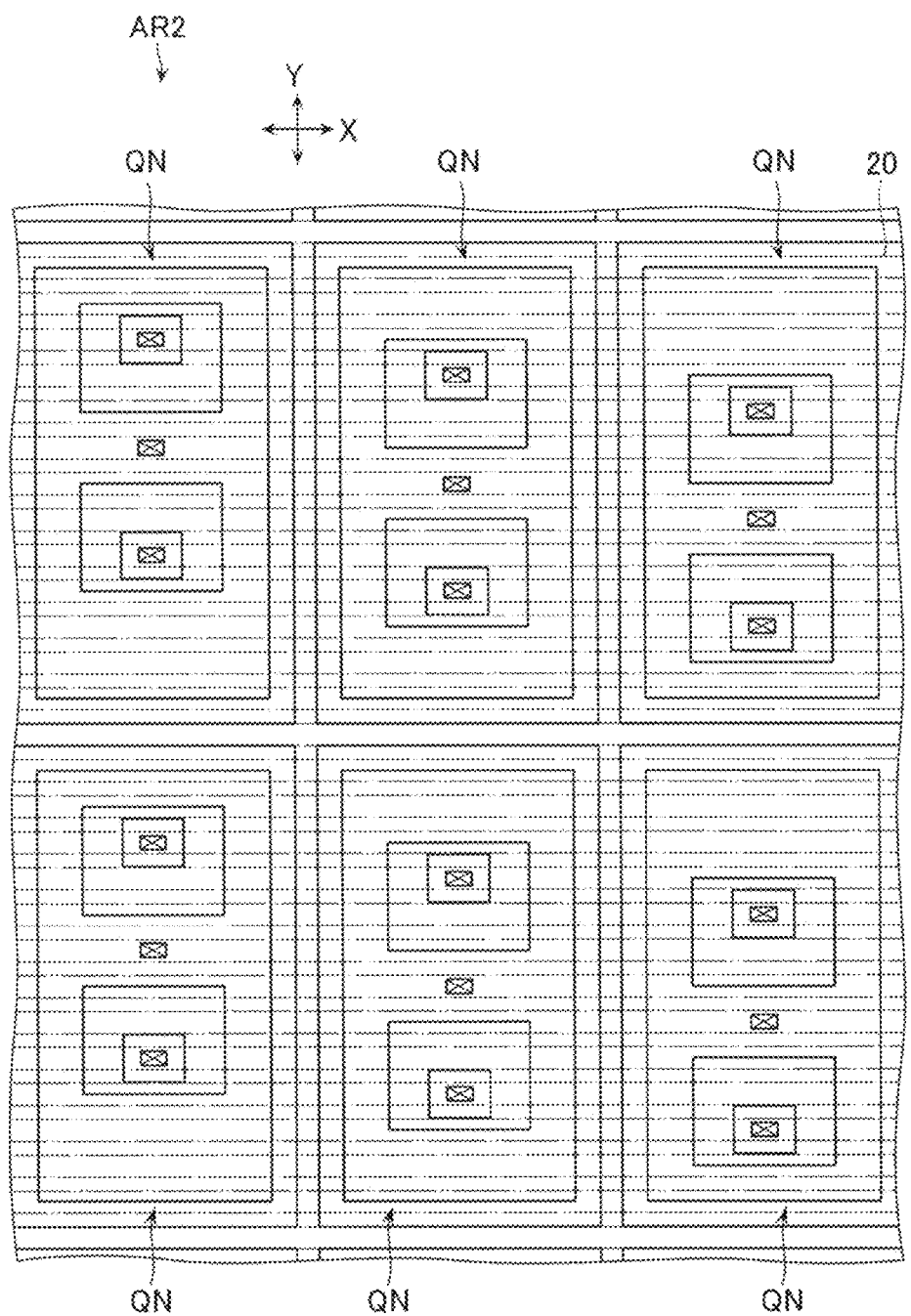
FIG. 3 is an example of a top view showing a transfer transistor QN in the decoder area AR2 according to the first embodiment.
Figure 4:
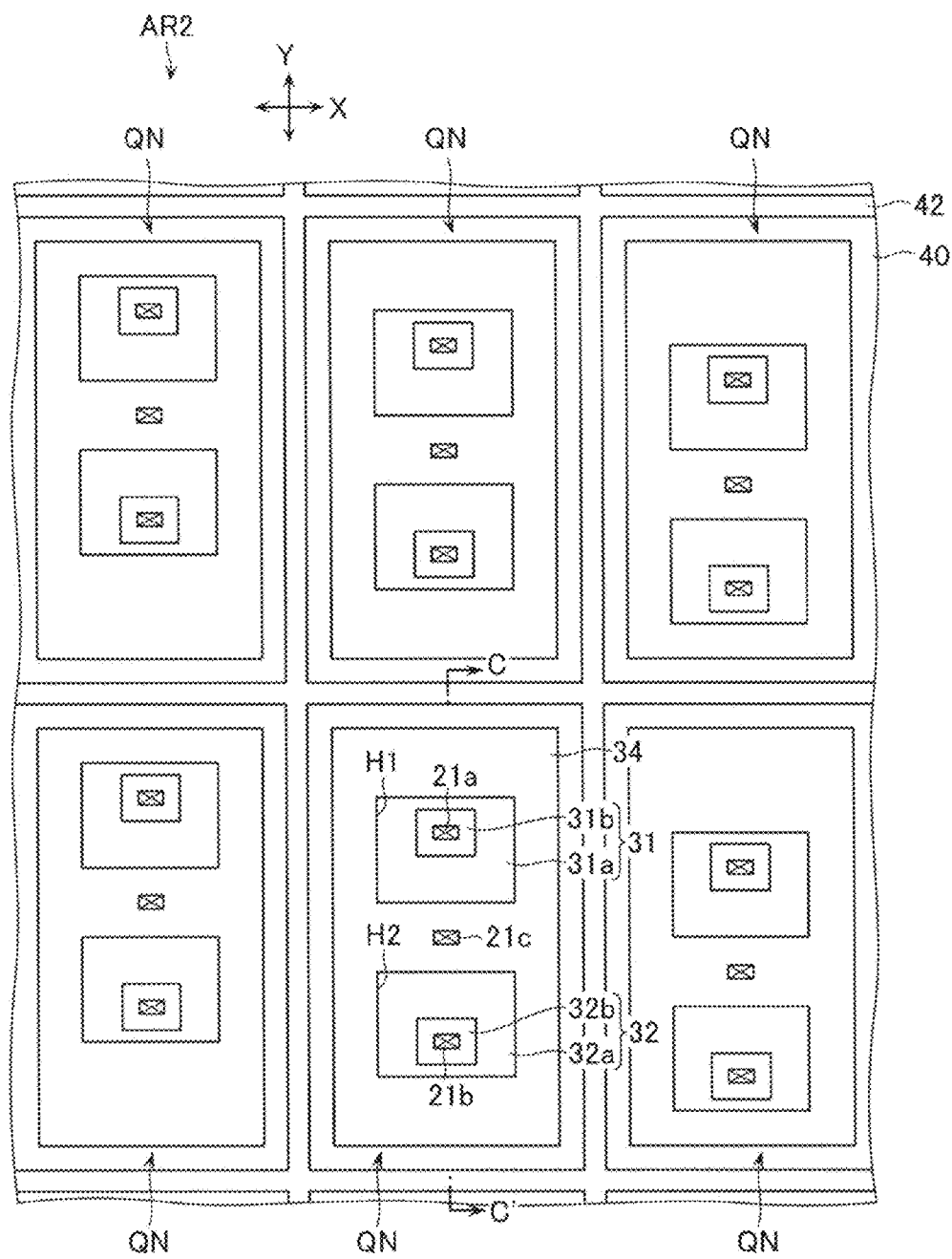
FIG. 4 is a view omitting an upper layer wiring line 20 from FIG. 3.

Next, a stacking structure of the decoder area AR2 (transfer transistor QN) will be described with reference to FIGS. 3~5. FIG. 3 is an example of a top view showing the transfer transistor QN. FIG. 4 is a view omitting an upper layer wiring line 20 from FIG. 3, and FIG. 5 is a cross-sectional view taken along the line C-C' of FIG. 4.

Figure 5:
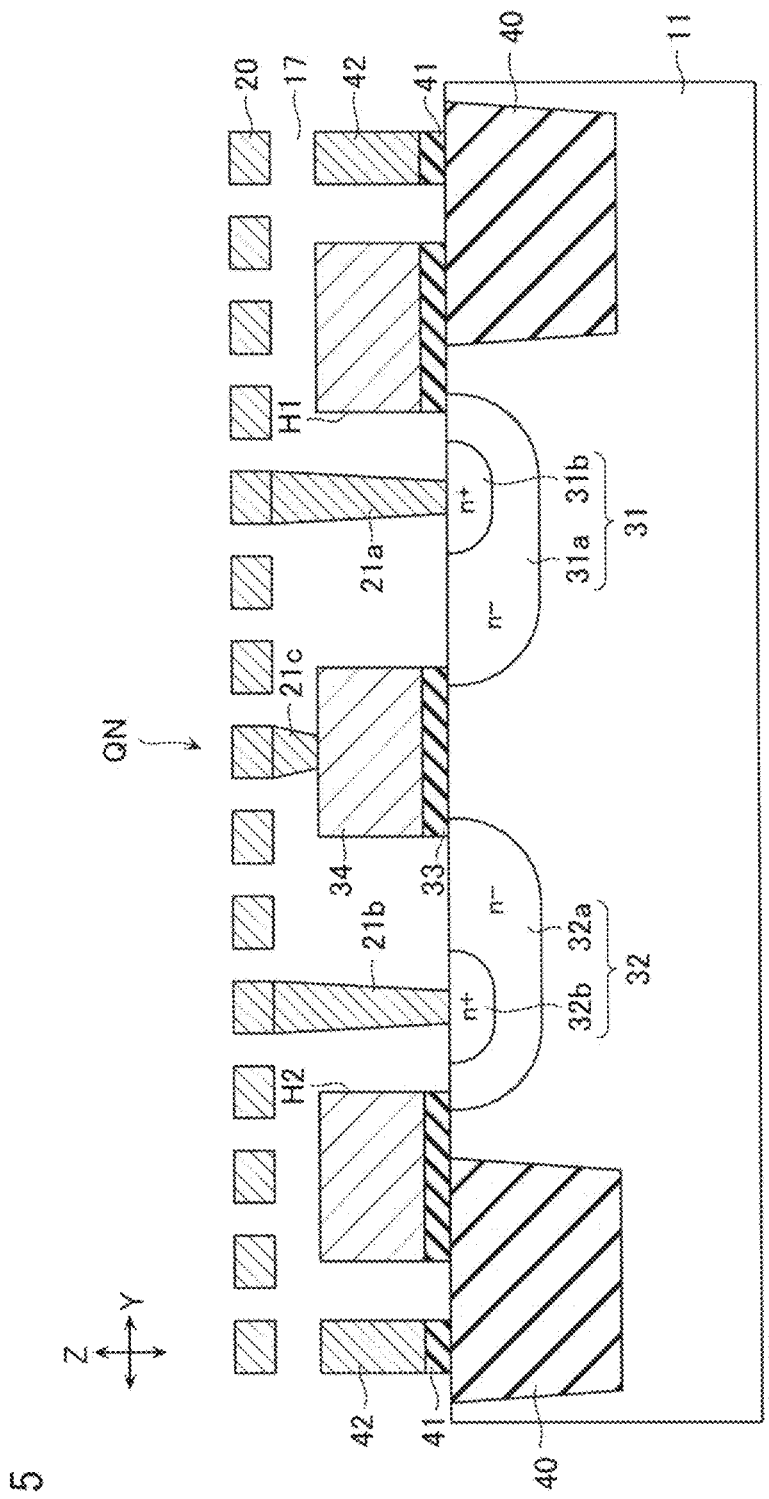
FIG. 5 is a cross-sectional view taken along the line C-C' of FIG. 4.

As shown in FIGS. 3~5, the transfer transistor QN in the decoder area AR2 is provided on the P type semiconductor substrate 11 isolated and insulated in a matrix in the X direction and the Y direction by an element isolation insulating layer 40. The element isolation insulating layer 40 is embedded in the P type semiconductor substrate 11 to an amount of a certain depth from a surface of the P type semiconductor substrate 11. The element isolation insulating layer 40 is formed in a grid as viewed from the Z direction.

As shown in FIGS. 4 and 5, the transfer transistor QN includes a drain diffusion region 31 and a source diffusion region 32 that are provided in the surface of the P type semiconductor substrate 11. The drain diffusion region 31 functions as a drain of the transfer transistor QN, and the source diffusion region 32 functions as a source of the transfer transistor QN. The source diffusion region 32 is provided separated from the drain diffusion region 31 in the Y direction.

The drain diffusion region 31 includes an n– type drain diffusion region 31*a* and an n+ type drain diffusion region 31*b*. Note that in the present embodiment, "n– type" means having an impurity concentration which is lower than that of "n type", and "n+ type" means having an impurity concentration which is higher than that of "n type".

The n– type drain diffusion region 31*a* is provided selectively in the surface of the P type semiconductor substrate 11. The n+ type drain diffusion region 31*b* is provided in a surface of the n– type drain diffusion region 31*a* and is connected to the upper layer wiring line 20 via a contact plug 21*a*. The upper layer wiring line 20 extends linearly in the X direction (gate width direction of the transfer transistor QN) (refer to FIG. 3).

The source diffusion region 32 includes an n– type source diffusion region 32*a* and an n+ type source diffusion region 32*b*. The n– type source diffusion region 32*a* is provided selectively in the surface of the P type semiconductor substrate 11. The n+ type source diffusion region 32*b* is provided in a surface of the n– type source diffusion region 32*a* and is connected to the upper layer wiring line 20 via a contact plug 21*b*.

As shown in FIGS. 4 and 5, the transfer transistor QN includes a gate insulating layer 33 and a gate electrode layer 34 on the P type semiconductor substrate 11. The gate electrode layer 34 functions as a gate of the transfer transistor QN.

The gate electrode layer 34 is provided on the P type semiconductor substrate 11 sandwiched by the pair of diffusion regions 32*a* and 32*b*, via the gate insulating layer 33. Moreover, the gate electrode layer 34 extends even to above the element isolation insulating layer 40, and entire outer edge of the gate electrode layer 34 is formed above the element isolation insulating layer 40. The gate electrode layer 34 covers the surface of the P type semiconductor substrate 11. At the same time, the gate electrode layer 34 includes openings H1 and H2. The opening H1 is provided directly above the drain diffusion region 31 (n– type drain diffusion region 31*a* and *n*+ type drain diffusion region 31*b*). The opening H2 is positioned directly above the source diffusion region 32 (n– type source diffusion region 32a and n+ type source diffusion region 32b). Therefore, the gate electrode layer 34 is formed in a "figure-of-eight" shape surrounding the drain diffusion region 31 and the source diffusion region 32, as viewed from the Z direction. In addition, the gate electrode layer 34 surrounds the contact plugs 21a and 21b. Furthermore, the gate electrode layer 34 is connected to the upper layer wiring line 20 via a contact plug 21c.

Now, it has been found that a voltage applied to the upper layer wiring line 20 causes a resistance value of the n– type drain diffusion region 31a and the n– type source diffusion region 32a to change, thereby affecting withstand voltage, reliability, and so on. For example, if a high voltage (for example, 16~25 V) is applied to a plurality of the upper layer wiring lines 20, then the resistance value of the n– type drain and source diffusion regions 31a and 32ba falls. If, on the other hand, a low voltage (for example, 0 V) is applied to a plurality of the upper layer wiring lines 20, then the resistance value of the n– type drain and source diffusion regions 31a and 32ba rises. Accordingly, the gate electrode layer 34 according to the present embodiment has a shape covering the surface of the P type semiconductor substrate 11 as described above. Therefore, the present embodiment enables an electric field of the upper layer wiring line 20 to be shielded by the gate electrode layer 34, whereby change in the resistance value of the n– type drain diffusion region 31a and the n– type source diffusion region 32a can be suppressed.

Next, a stacking structure above the element isolation insulating layer 40 will be described with reference to FIGS. 3~5. A shield conductive layer 42 is formed on a surface of the element isolation insulating layer 40, via an insulating layer 41. The shield conductive layer 42 is formed in a grid as viewed from the Z direction. An upper surface of the shield conductive layer 42 and an upper surface of the gate electrode layer 34 are set at substantially the same height. The shield conductive layer 42 is set to ground (0 V) or floating, thereby shielding a current flowing in the X direction and the Y direction.

The stacking structure of the transfer transistor QN and the shield conductive layer 42 as described above are covered by an inter-layer insulating layer 17, on which the upper layer wiring lines 20 are arranged.

[Second Embodiment]

Figure 6:
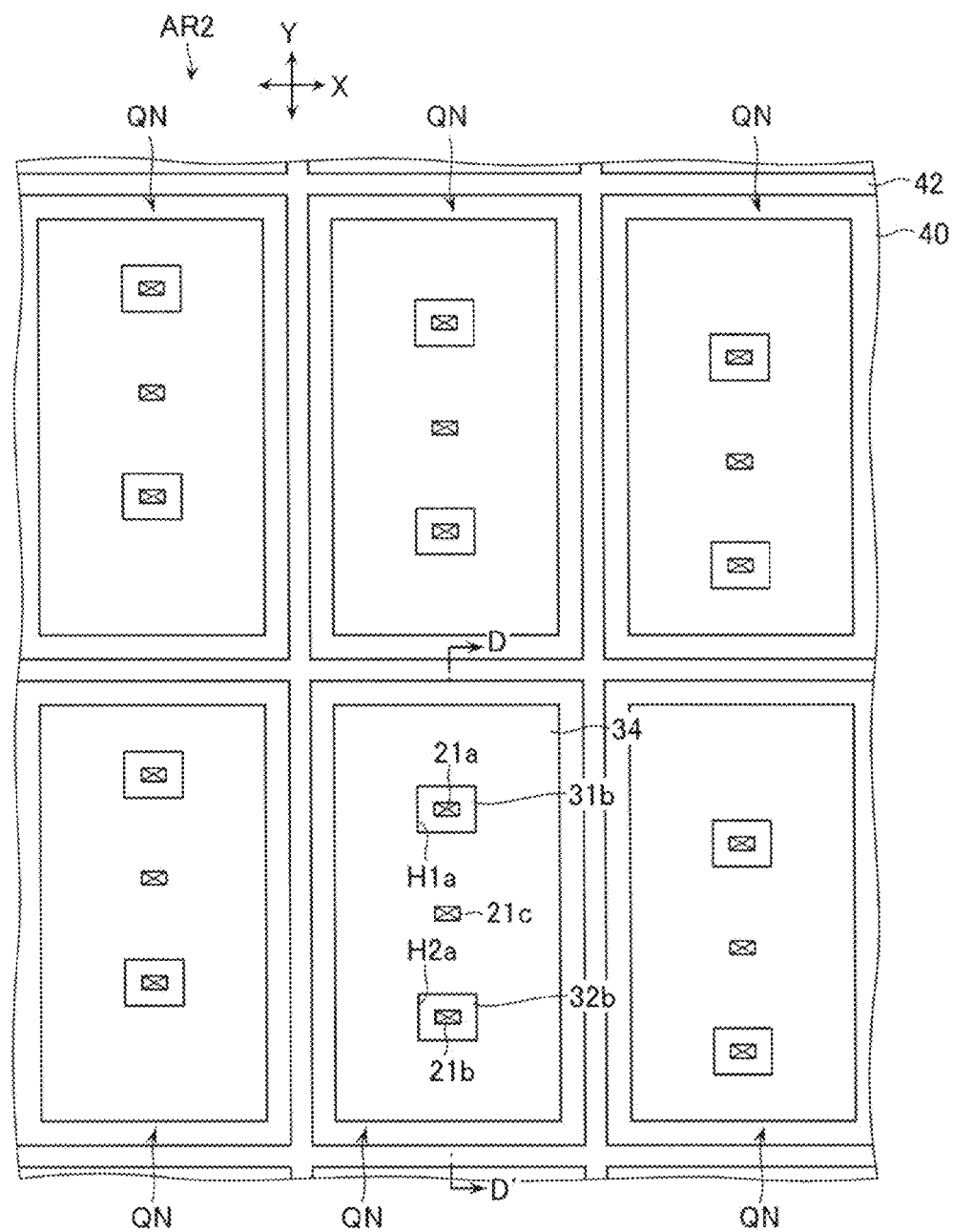
FIG. 6 is an example of a top view showing a transfer transistor QN in a decoder area AR2 according to a second embodiment.
Figure 7:
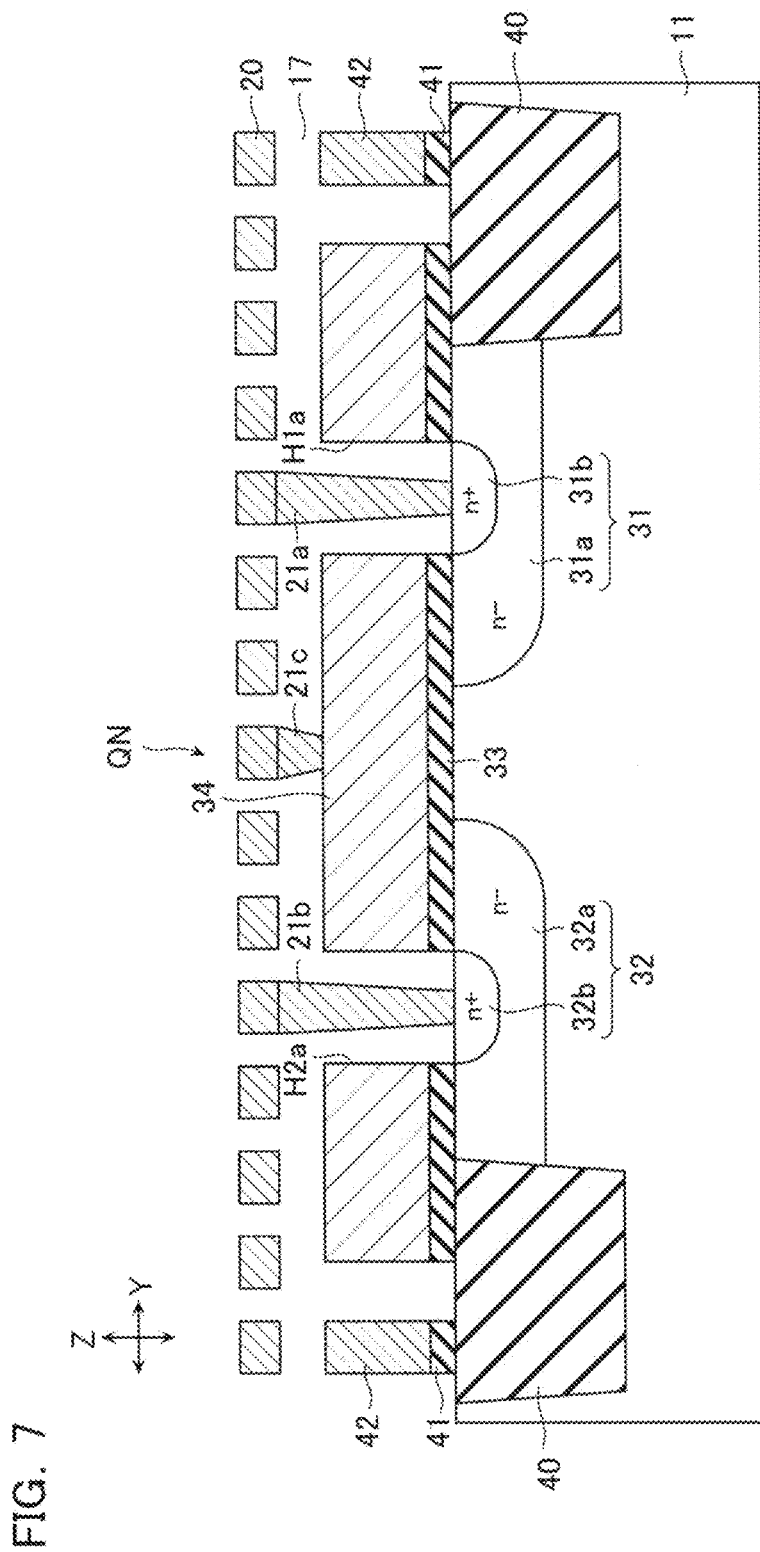
FIG. 7 is a cross-sectional view taken along the line D-D' of FIG. 6.

Next, a nonvolatile semiconductor memory device according to a second embodiment will be described. The second embodiment has a circuit configuration and a stacking structure of the memory area AR1 that are similar to those of the first embodiment. On the other hand, the second embodiment has a stacking structure of the decoder area AR2 (transfer transistor QN) which is different to that of the first embodiment. Accordingly, in the second embodiment, the stacking structure of the decoder area AR2 (transfer transistor QN) will be described with reference to FIGS. 6 and 7, and descriptions of configurations similar to those in the first embodiment are omitted. FIG. 6 is an example of a top view showing the decoder area AR2 (transfer transistor QN) according to the second embodiment, and FIG. 7 is a cross-sectional view taken along the line D-D' of FIG. 6. Note that the upper layer wiring line 20 is omitted in FIG. 6.

As shown in FIGS. 6 and 7, the transfer transistor QN in the second embodiment includes a gate electrode layer 34 which is different to that of the first embodiment. Note that other configurations are similar to those of the first embodiment, hence descriptions of those other configurations are omitted.

As shown in FIGS. 6 and 7, the gate electrode layer 34 covers not only the surface of the P type semiconductor substrate 11, but also a surface of the n– type drain diffusion region 31a and the n– type source diffusion region 32a. At the same time, the gate electrode layer 34 includes openings H1a and H2a. The opening H1a is provided directly above the n+ type drain diffusion region 31b. The opening H2a is provided directly above the n+ type source diffusion region 32b. Therefore, the gate electrode layer 34 is formed in a "figure-of-eight" shape surrounding the n+ type drain diffusion region 31b and the n+ type source diffusion region 32b, as viewed from the Z direction. In addition, the gate electrode layer 34 surrounds the contact plugs 21a and 21b.

As described above, in the second embodiment, the gate electrode layer 34 covers the n– type drain diffusion region 31a and the n– type source diffusion region 32a. As a result, the present embodiment enables an electric field of the upper layer wiring line 20 directly above the diffusion regions 31a and 32a to be shielded by the gate electrode layer 34, whereby change in the resistance value of the n– type drain diffusion region 31a and the n– type source diffusion region 32a can be suppressed more than in the first embodiment.

[Third Embodiment]

Next, a nonvolatile semiconductor memory device according to a third embodiment will be described. The third embodiment has a circuit configuration similar to that of the first embodiment. On the other hand, the third embodiment has stacking structures of the memory area AR1 (memory cell MC) and the decoder area AR2 (transfer transistor QN) which are different to those of the first embodiment.

Figure 8:
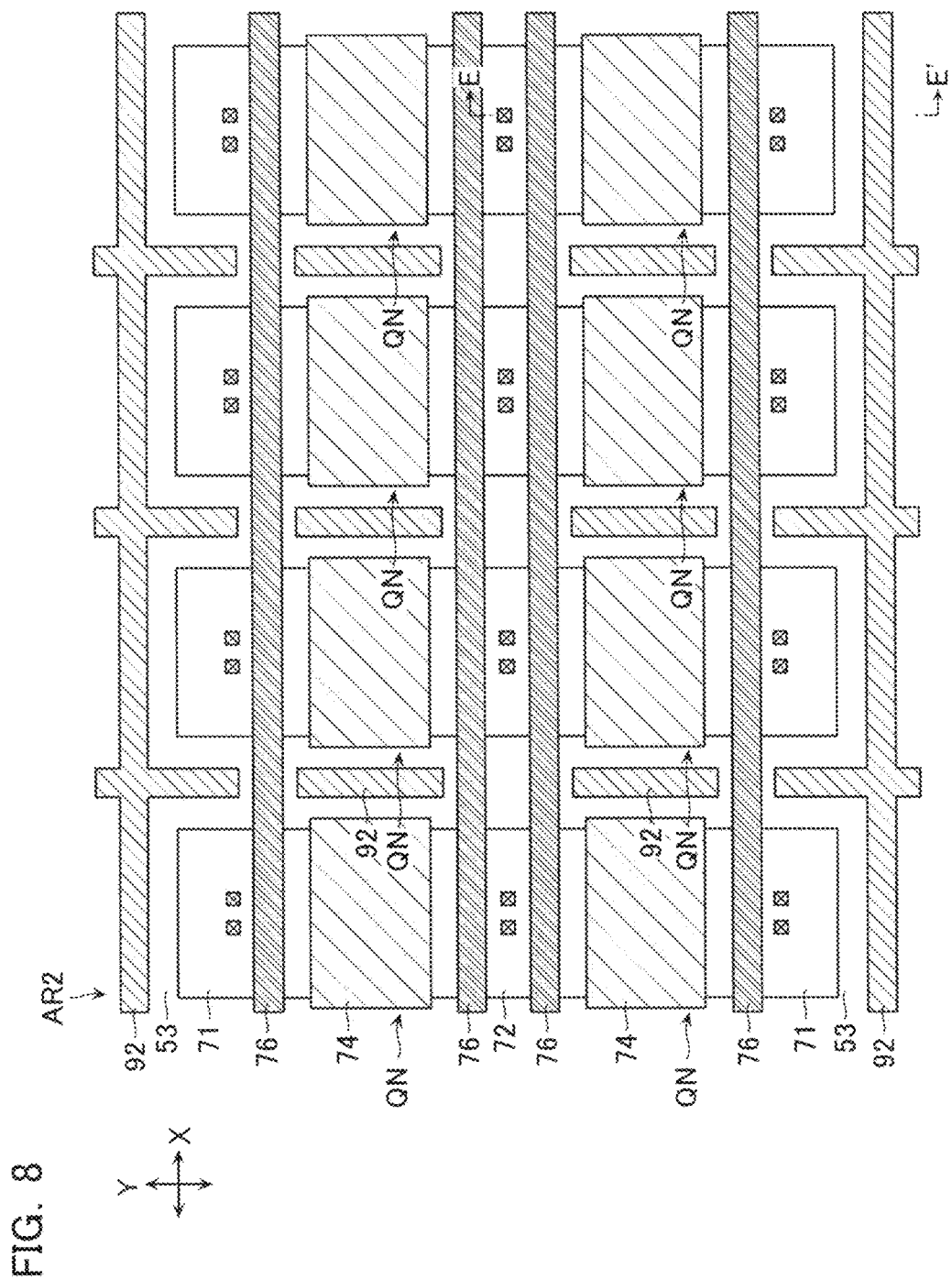
FIG. 8 is an example of a top view showing a transfer transistor QN in a decoder area AR2 according to a third embodiment.
Figure 9:
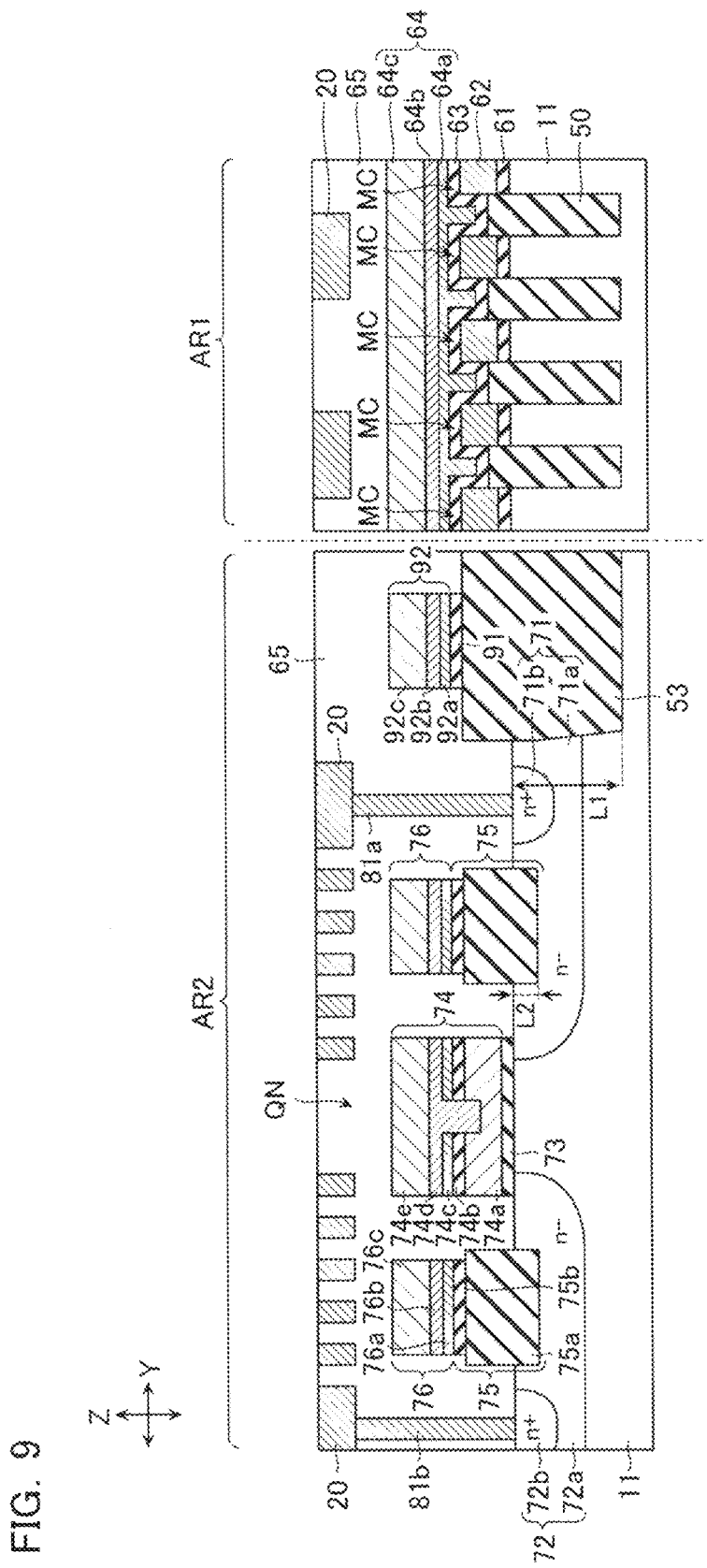
FIG. 9 is a cross-sectional view taken along the line E-E' of FIG. 8 and a cross-sectional view of a memory cell MC.

The stacking structures of the memory area AR1 (memory cell MC) and the decoder area AR2 (transfer transistor QN) are described below with reference to FIGS. 8 and 9. FIG. 8 is an example of a top view showing a transfer transistor QN in a decoder area AR2 according to the third embodiment. FIG. 9 is a cross-sectional view taken along the line E-E' of FIG. 8 and a cross-sectional view of a memory cell MC.

First, the stacking structure of the memory area AR1 (memory cell MC) will be described. As shown in FIG. 9, in the memory area AR1, the memory cell MC is formed on the P type semiconductor substrate 11 isolated and insulated by an element isolation insulating layer 50. The element isolation insulating layer 50 is embedded in the P type semiconductor substrate 11 to an amount of a certain depth from the surface of the P type semiconductor substrate 11. An upper surface of the element isolation insulating layer 50 protrudes above an upper surface of the P type semiconductor substrate 11.

As shown in FIG. 9, the memory cell MC includes a floating gate layer 62 on the P type semiconductor substrate 11 sandwiched by the element isolation insulating layer 50, via a memory gate insulating layer 61. The floating gate layer 62 functions as a floating gate of the memory cell MC. A lower surface of the floating gate layer 62 is positioned below the upper surface of the element isolation insulating layer 50, and an upper surface of the floating gate layer 62 is positioned above the upper surface of the element isolation insulating layer 50. The floating gate layer 62 is configured by, for example, polysilicon. Note that a diffusion region functioning as a source/drain of the memory cell MC is formed in the P type semiconductor substrate 11 (not illustrated).

As shown in FIG. 9, the memory cell MC includes a gate electrode layer 64 on the floating gate layer 62 via a memory gate insulating layer 63. The gate electrode layer 64 functions as a gate of the memory cell MC and as the word line WL. The gate electrode layer 64 includes gate electrode layers 64a-64c. A lower surface of the gate electrode layer 64a protrudes downward above the element isolation insulating layer 50, and an upper surface of the gate electrode layer 64a is formed flatly. The gate electrode layer 64b is provided on the upper surface of the gate electrode layer 64a, and the gate electrode layer 64c is provided on an upper surface of the gate electrode layer 64b. The gate electrode layer 64a and the gate electrode layer 64b are configured by polysilicon, and the gate electrode layer 64c is configured by a metal.

The above-described stacking structure of the memory cell MC is covered by an inter-layer insulating layer 65, on which the upper layer wiring line 20 is provided.

Next, the stacking structure of the decoder area AR2 (transfer transistor QN) will be described. As shown in FIGS. 8 and 9, the transfer transistor QN is formed on the P type semiconductor substrate 11 isolated and insulated by an element isolation insulating layer 53. The element isolation insulating layer 53 is embedded in the P type semiconductor substrate 11 to an amount of a depth L1 from the surface of the P type semiconductor substrate 11. An upper surface of the element isolation insulating layer 53 is positioned above the upper surface of the P type semiconductor substrate 11. Moreover, the upper surface of the element isolation insulating layer 53 aligns with the upper surface of the floating gate layer 62.

As shown in FIGS. 8 and 9, the transfer transistor QN includes a drain diffusion region 71 and a source diffusion region 72 that are formed in the surface of the P type semiconductor substrate 11. The drain diffusion region 71 functions as a drain of the transfer transistor QN, and the source diffusion region 72 functions as a source of the transfer transistor QN. The drain diffusion region 71 is formed separated from the source diffusion region 72 in the Y direction.

The drain diffusion region 71 includes an n– type drain diffusion region 71a and an n+ type drain diffusion region 71b. The n– type drain diffusion region 71a is provided selectively in the surface of the P type semiconductor substrate 11. The n+ type drain diffusion region 71b is provided in a surface of the n– type drain diffusion region 71a and is connected to the upper layer wiring line 20 via a contact plug 81a.

The source diffusion region 72 includes an n– type source diffusion region 72a and an n+ type source diffusion region 72b. The n– type source diffusion region 72a is provided selectively in the surface of the P type semiconductor substrate 11. The n+ type source diffusion region 72b is provided in a surface of the n-type source diffusion region 72a and is connected to the upper layer wiring line 20 via a contact plug 81b.

As shown in FIG. 9, the transfer transistor QN includes a gate electrode layer 74 on the P type semiconductor substrate 11, via a gate insulating layer 73. The gate insulating layer 73 is provided in the same layer as the memory gate insulating layer 61. The gate electrode layer 74 functions as a gate of the transfer transistor QN.

As shown in FIG. 8, the gate electrode layer 74 is formed in a rectangular shape directly above a region sandwiched by the drain diffusion region 71 and the source diffusion region 72, as viewed from the Z direction. As shown in FIG. 9, the gate electrode layer 74 includes, stacked sequentially, a gate electrode layer 74a, an electrode insulating layer 74b, and gate electrode layers 74c-74e.

The gate electrode layer 74a is provided in the same layer as the floating gate layer 62, and is formed such that an upper surface of the gate electrode layer 74a aligns with the upper surface of the floating gate layer 62. The electrode insulating layer 74b is provided in the same layer as the memory gate insulating layer 63, and is formed such that an upper surface of the electrode insulating layer 74b aligns with the upper surface of the memory gate insulating layer 63. The gate electrode layer 74c is provided in the same layer as the gate electrode layer 64a, and is formed such that an upper surface of the gate electrode layer 74c aligns with the upper surface of the gate electrode layer 64a.

The gate electrode layer 74d is provided in the same layer as the gate electrode layer 64b, and is formed such that an upper surface of the gate electrode layer 74d aligns with the upper surface of the gate electrode layer 64b. Moreover, the gate electrode layer 74d includes a protrusion that penetrates the electrode insulating layer 74b and the gate electrode layer 74c to reach the gate electrode layer 74a. The gate electrode layer 74e is provided in the same layer as the gate electrode layer 64c, and is formed such that an upper surface of the gate electrode layer 74e aligns with the upper surface of the gate electrode layer 64c. The gate electrode layers 74a, 74c, and 74d are configured by polysilicon. The gate electrode layer 74e is configured by a metal.

Furthermore, as shown in FIG. 9, the transfer transistor QN includes a pair of block conductive layers 76 on the n– type drain diffusion region 71a and the n-type source diffusion region 72a, via a block insulating layer 75. For example, the block conductive layer 76 is applied with a different voltage, according to the voltage applied to the memory cell MC. The block insulating layer 75 and block conductive layer 76 are disposed at a nearer position than the contact plugs 81a and 81b, as viewed from the gate electrode layer 74. In other words, the contact plugs 81a and 81b are disposed at a more distant position than the block insulating layer 75 and block conductive layer 76, as viewed from the gate electrode layer 74.

The block insulating layer 75 is embedded in the P type semiconductor substrate 11 to an amount of a depth L2 from the surface of the P type semiconductor substrate 11. The depth L2 is shorter than the depth L1. A film thickness of the block insulating layer 75 is thicker than a film thickness of the gate insulating layer 73. The block insulating layer 75 includes block insulating layers 75a and 75b that are stacked sequentially. An upper surface of the block insulating layer 75a is formed to align with the upper surface of the element isolation insulating layer 53. The block insulating layer 75b is provided in the same layer as the electrode insulating layer 74b, and is formed such that an upper surface of the block insulating layer 75b aligns with the upper surface of the electrode insulating layer 74b.

As shown in FIG. 8, the block conductive layer 76 extends in the X direction to be shared by a plurality of the transfer transistors QN aligned in the X direction. As shown in FIG. 9, the block conductive layer 76 includes block conductive layers 76a-76c that are stacked sequentially. The block conductive layer 76a is provided in the same layer as the gate electrode layer 74c, and is formed such that an upper surface of the block conductive layer 76a aligns with the upper surface of the gate electrode layer 74c. The block conductive layer 76b is provided in the same layer as the gate electrode layer 74d, and is formed such that an upper surface of the block conductive layer 76b aligns with the upper surface of the gate electrode layer 74d. The block conductive layer 76c is provided in the same layer as the gate electrode layer 74e, and is formed such that an upper surface of the block conductive layer 76c aligns with the upper surface of the gate electrode layer 74e. The block conductive layers 76a and 76b are configured by polysilicon, and the block conductive layer 76c is configured by a metal.

Now, as mentioned above, a voltage applied to the upper layer wiring line 20 causes a resistance value of the n– type drain diffusion region 71a and the n– type source diffusion region 72a to change. Accordingly, the present embodiment includes the block conductive layer 76 provided on the n– type drain diffusion region 71a and the n− type source diffusion region 72a, via the block insulating layer 75. Therefore, the present embodiment enables an electric field of the upper layer wiring line 20 to be shielded by the block conductive layer 76, whereby change in the resistance value of the n− type drain diffusion region 71a and the n− type source diffusion region 72a can be suppressed.

Next, a stacking structure above the element isolation insulating layer 53 will be described with reference to FIGS. 8 and 9. A shield conductive layer is formed on a surface of the element isolation insulating layer 53, via an insulating layer 91. The shield conductive layer 92 is formed in a comb tooth shape as viewed from the Z direction, at an end in the Y direction of the drain diffusion region 71. Moreover, the shield conductive layer 92 is formed in a rectangular shape extending in the Y direction as viewed from the Z direction, at an end in the X direction of the gate electrode layer 74. The shield conductive layer 92 is set to ground (0 V) or floating, thereby shielding a current flowing in the X direction and the Y direction.

As shown in FIG. 9, the shield conductive layer 92 includes shield conductive layers 92a-92c that are stacked sequentially. The shield conductive layer 92a is provided in the same layer as the gate electrode layer 74c, and is formed such that an upper surface of the shield conductive layer 92a aligns with the upper surface of the gate electrode layer 74c. The shield conductive layer 92b is provided in the same layer as the gate electrode layer 74d, and is formed such that an upper surface of the shield conductive layer 92b aligns with the upper surface of the gate electrode layer 74d. The shield conductive layer 92c is provided in the same layer as the gate electrode layer 74e, and is formed such that an upper surface of the shield conductive layer 92c aligns with the upper surface of the gate electrode layer 74e. The shield conductive layers 92a and 92b are configured by polysilicon, and the shield conductive layer 92c is configured by a metal.

The stacking structure of the transfer transistor QN and the shield conductive layer 92 as described above are covered by an inter-layer insulating layer 65, on which the upper layer wiring lines 20 are arranged.

Next, a manufacturing method of the memory area AR1 (memory cell MC) and the decoder area AR2 (transfer transistor QN) according to the third embodiment will be described with reference to FIGS. 10~17. FIGS. 10~17 are cross-sectional views showing the manufacturing method of the transfer transistor QN and the memory cell MC according to the third embodiment.

Figure 10:
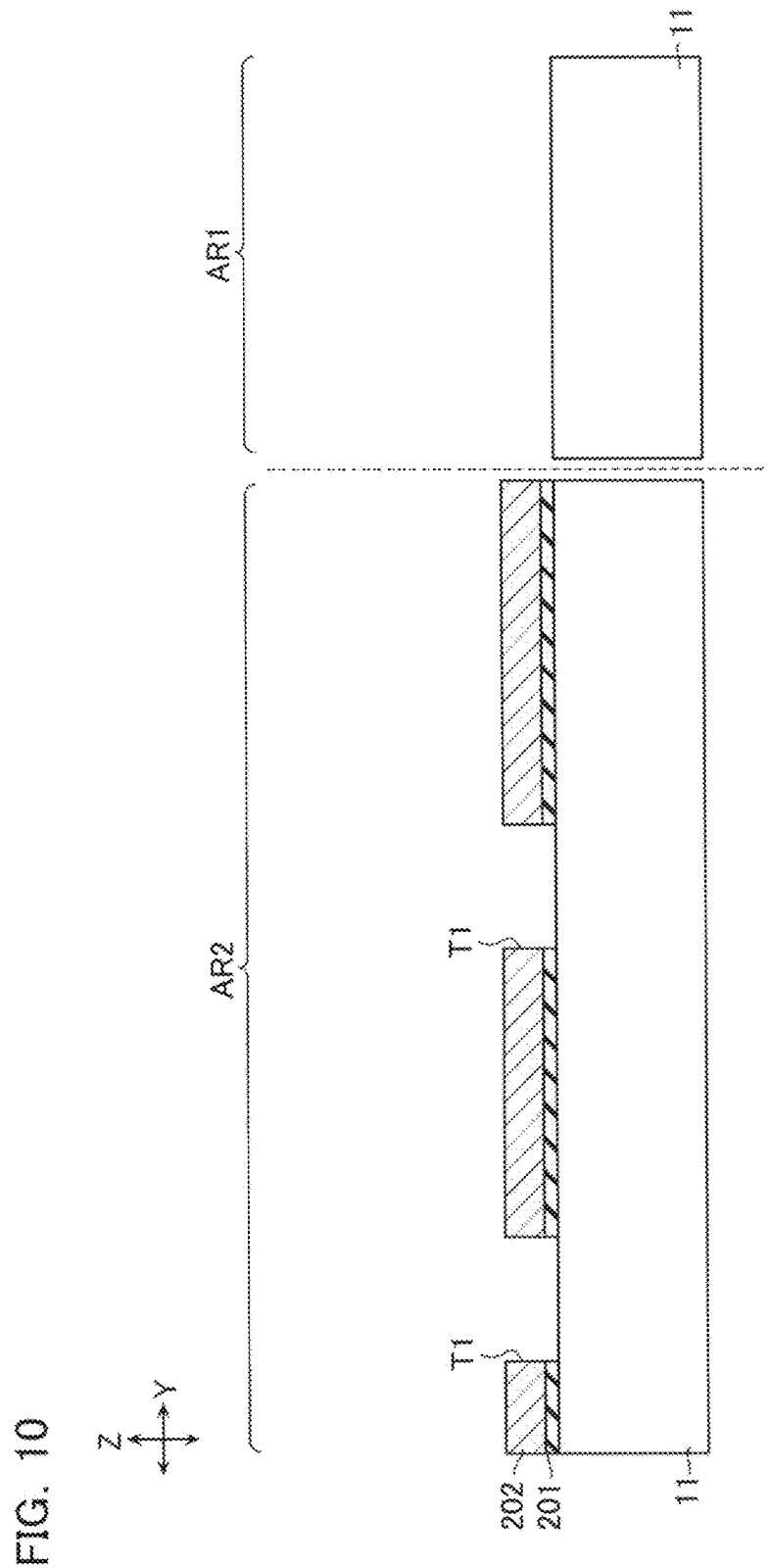
FIG. 10 is a cross-sectional view showing a manufacturing method of the transfer transistor QN and the memory cell MC according to the third embodiment.

First, as shown in FIG. 10, an insulating layer 201 and a polysilicon layer 202 are deposited on the P type semiconductor substrate 11 in the decoder area AR2. Then, a trench T1 is formed in the insulating layer 201 and the polysilicon layer 202. Note that the insulating layer 201 and the polysilicon layer 202 are not formed on the P type semiconductor substrate 11 in the memory area AR1.

Figure 11:
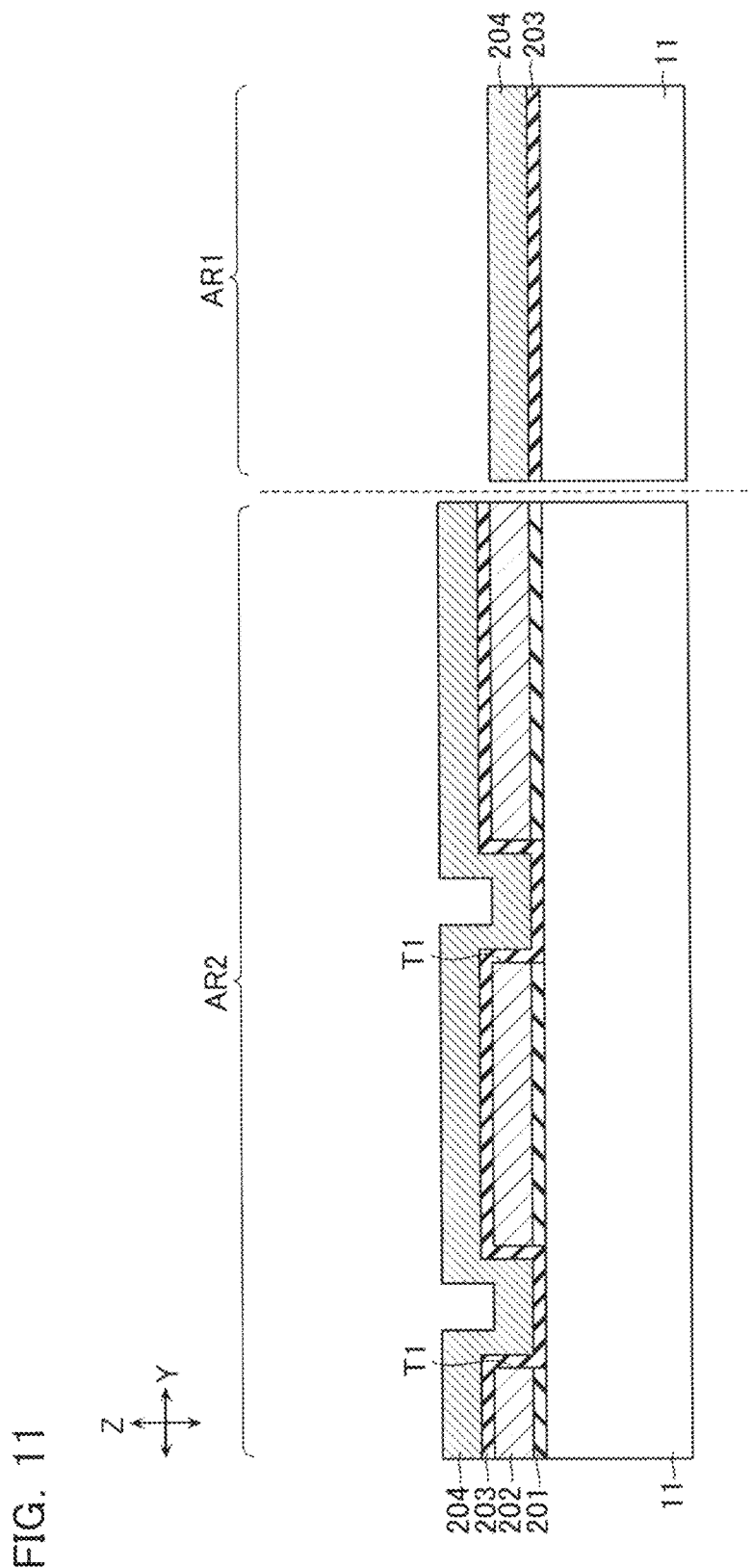
FIG. 11 is a cross-sectional view showing the manufacturing method of the transfer transistor QN and the memory cell MC according to the third embodiment.
Figure 12:
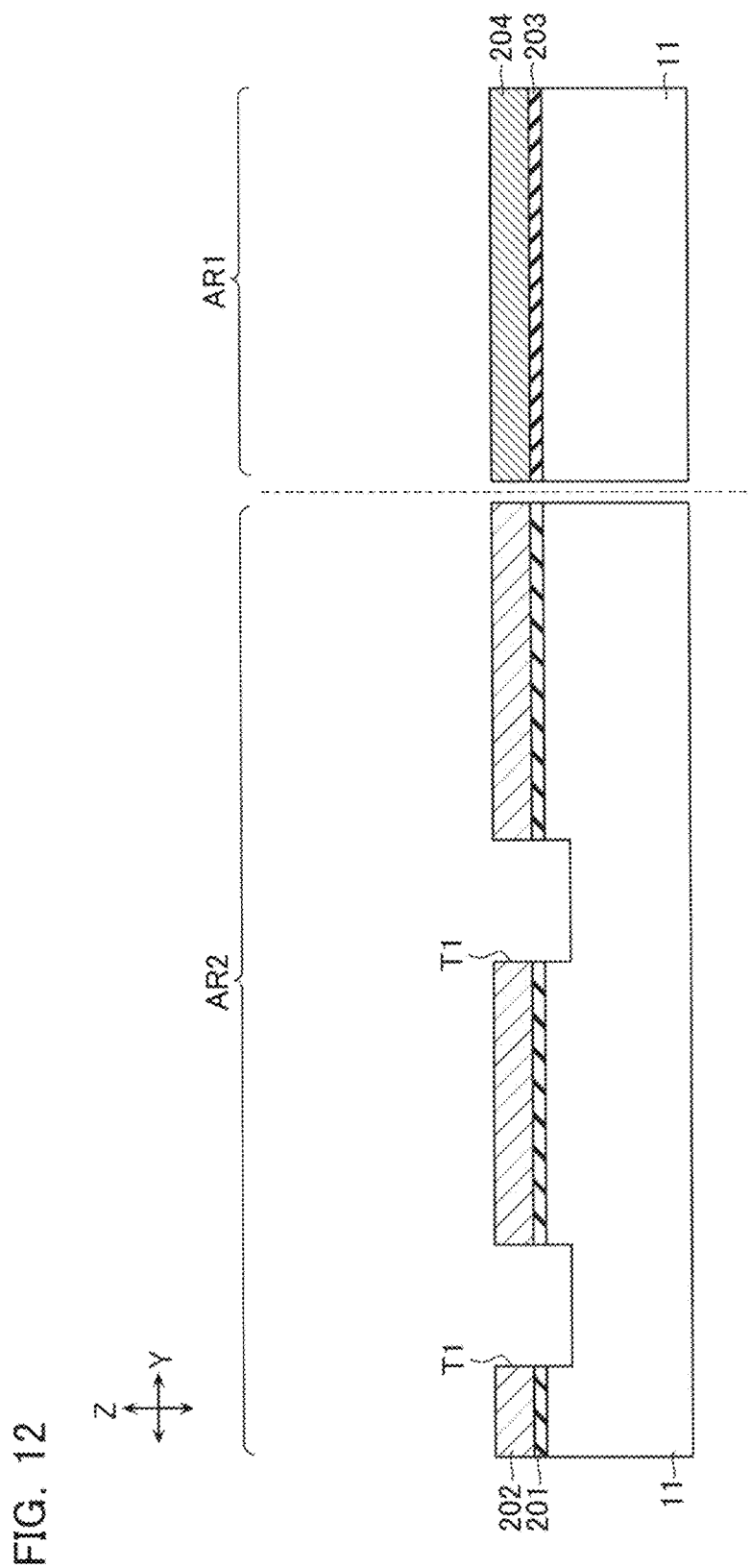
FIG. 12 is a cross-sectional view showing the manufacturing method of the transfer transistor QN and the memory cell MC according to the third embodiment.

Next, as shown in FIG. 11, an insulating layer 203 and a polysilicon layer 204 are deposited in the areas AR1 and AR2. Then, as shown in FIG. 12, the insulating layer 203 and the polysilicon layer 204 in the area AR2 are removed by etching. As a result of this etching, the trench T1 extends downward digging into the P type semiconductor substrate 11. In contrast, the insulating layer 203 and the polysilicon layer 204 in the area AR1 are allowed to remain.

Figure 13:
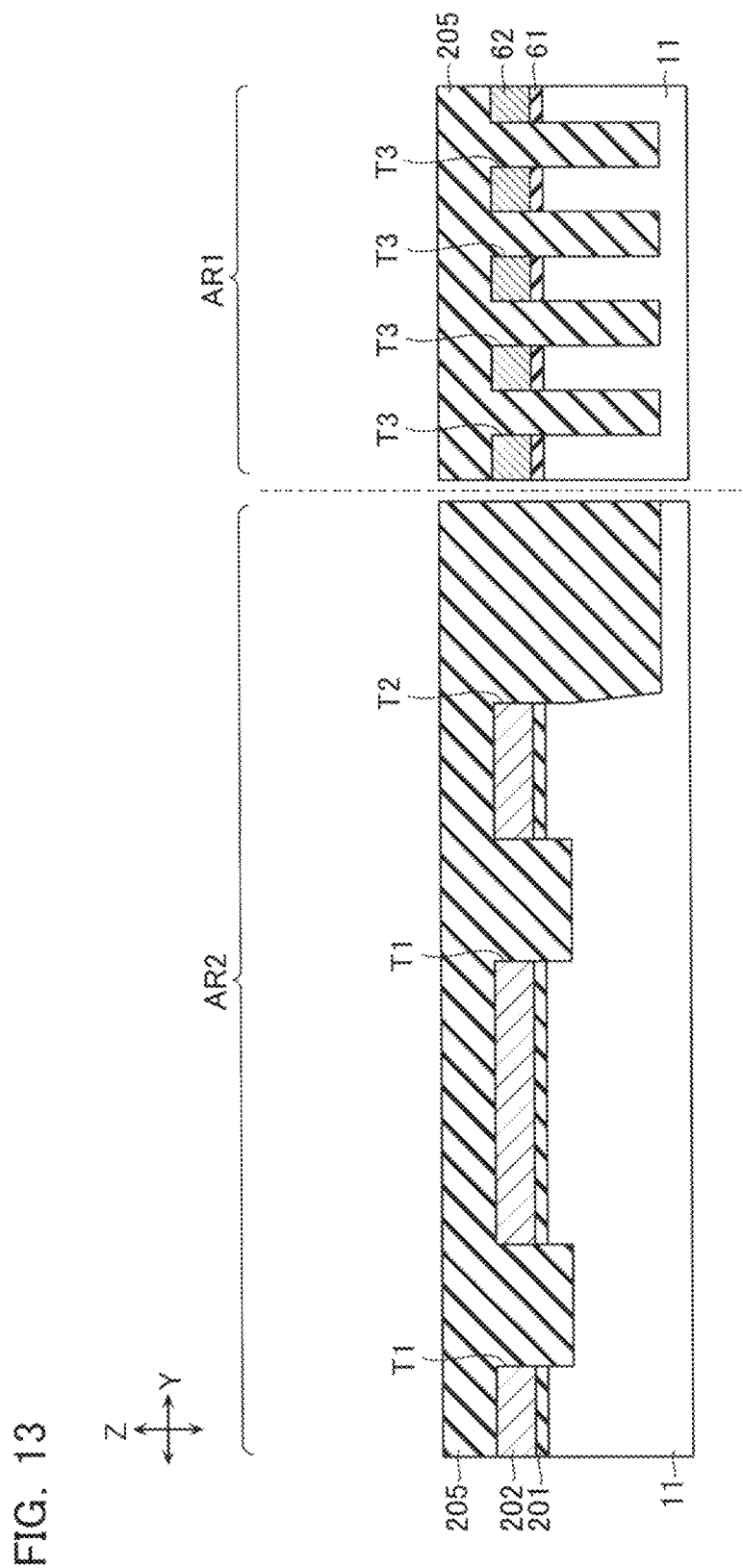
FIG. 13 is a cross-sectional view showing the manufacturing method of the transfer transistor QN and the memory cell MC according to the third embodiment.

Next, as shown in FIG. 13, a trench T2 is formed in the area AR2, and a trench T3 is formed in the area AR1. Now, the trench T2 is deeper than the trench T1. The trench T3 has the same depth as the trench T2. In addition, an insulating layer 205 is deposited to fill the trenches T1~T3. Note that the insulating layer 203 divided by the trench T3 becomes the memory gate insulating layer 61 shown in FIG. 9. Moreover, the polysilicon layer 204 divided by the trench T3 becomes the floating gate layer 62 shown in FIG. 9. For example, in FIG. 17, a material for filling in the trenches T1 and T2 in the area AR1 may be different from a material for filling in the trench T3 in the area AR2, without being limited to the above-described example.

Figure 14:
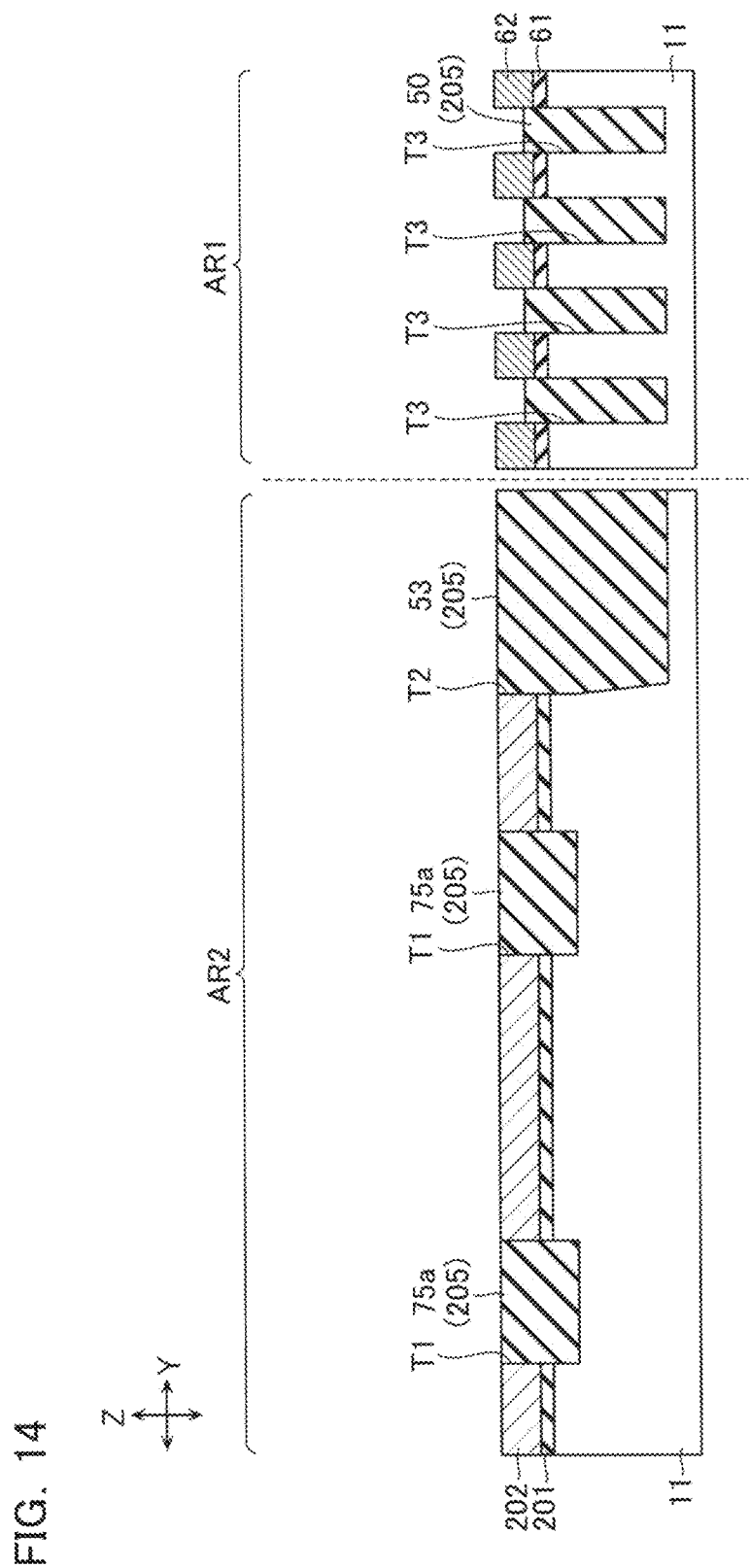
FIG. 14 is a cross-sectional view showing the manufacturing method of the transfer transistor QN and the memory cell MC according to the third embodiment.

Then, as shown in FIG. 14, an upper surface of the insulating layer 205 and an upper surface of the polysilicon layer 202 in the area AR2 are aligned. As a result, the insulating layer 205 in the trench T1 becomes the insulating layer 75a shown in FIG. 9, and the insulating layer 205 in the trench T2 becomes the element isolation insulating layer 53 shown in FIG. 9.

In addition, as shown in FIG. 14, the insulating layer 205 in the area AR1 is removed by etching, to a height between the upper surface and the lower surface of the floating gate layer 62. As a result of this etching, the insulating layer 205 in the trench T3 becomes the element isolation insulating layer 50 shown in FIG. 9.

Figure 15:
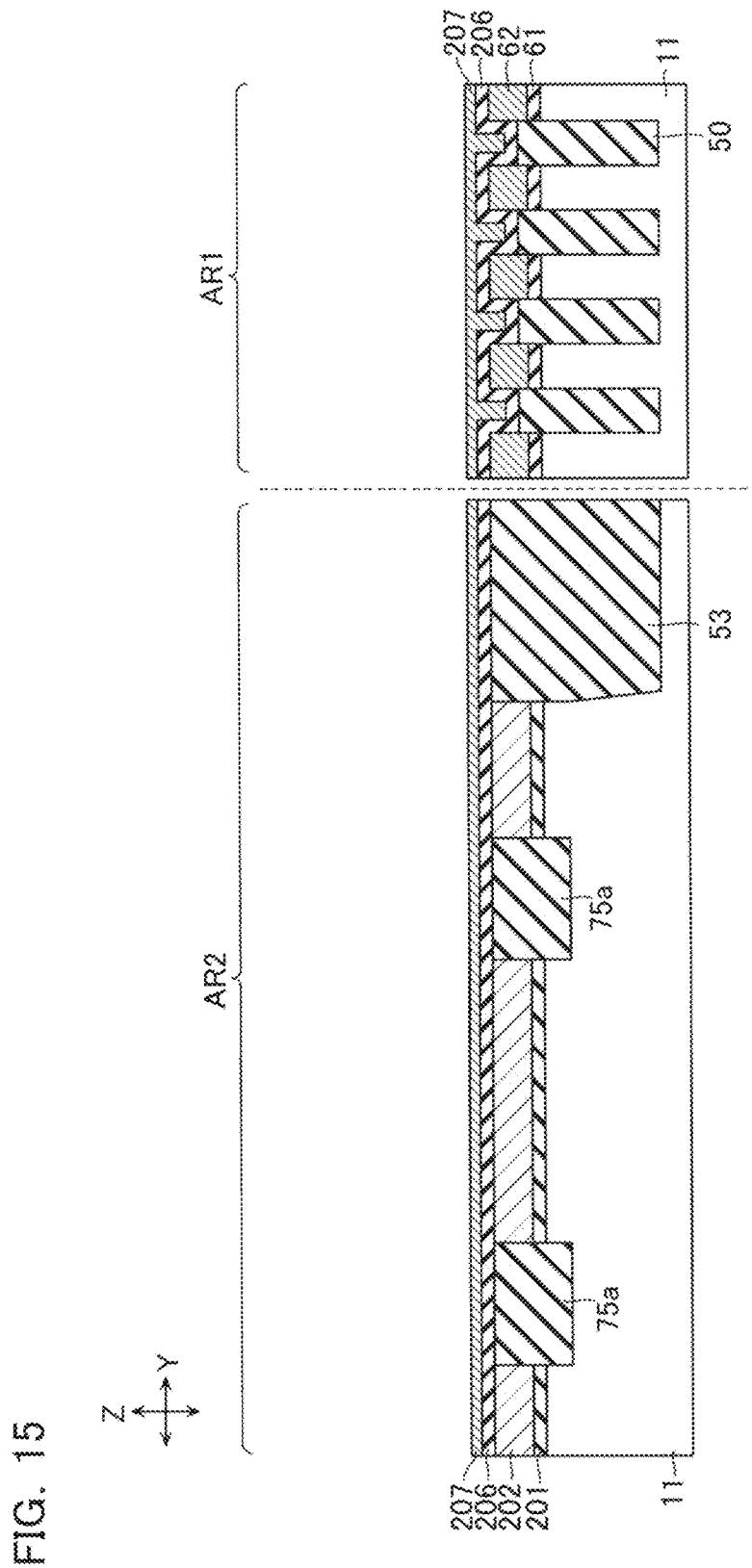
FIG. 15 is a cross-sectional view showing the manufacturing method of the transfer transistor QN and the memory cell MC according to the third embodiment.
Figure 16:
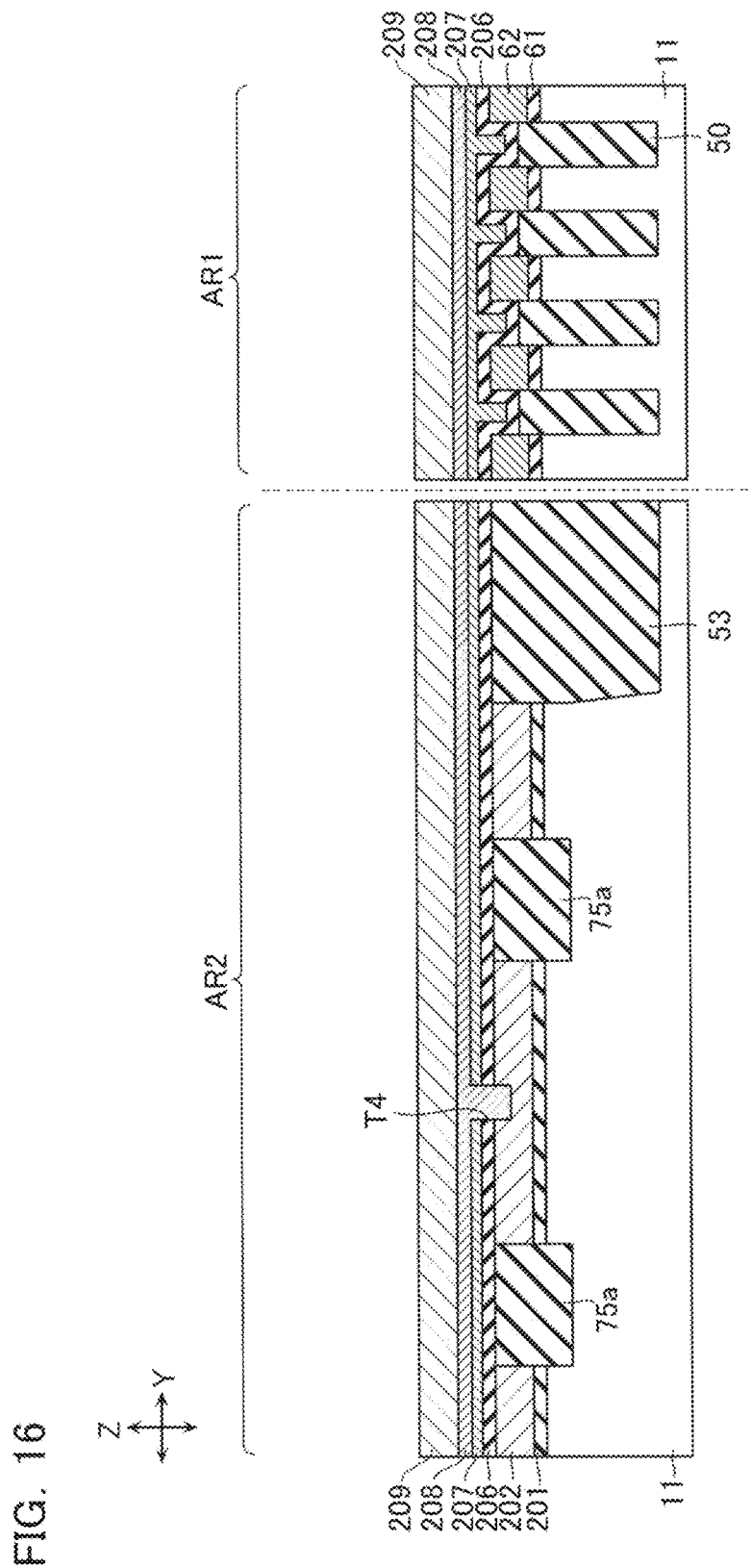
FIG. 16 is a cross-sectional view showing the manufacturing method of the transfer transistor QN and the memory cell MC according to the third embodiment.

Then, as shown in FIG. 15, an insulating layer 206 and a polysilicon layer 207 are deposited in the areas AR1 and AR2. Next, as shown in FIG. 16, a trench T4 is formed at a place sandwiched by a pair of the insulating layers 75a in the area AR2. The trench T4 is formed penetrating the polysilicon layer 207 and the insulating layer 206 to dig into the polysilicon layer 202. Then, a polysilicon layer 208 is deposited in the areas AR1 and AR2 to fill in the trench T4. Then, as shown in FIG. 16, a metal layer 209 is deposited in the areas AR1 and AR2.

Figure 17:
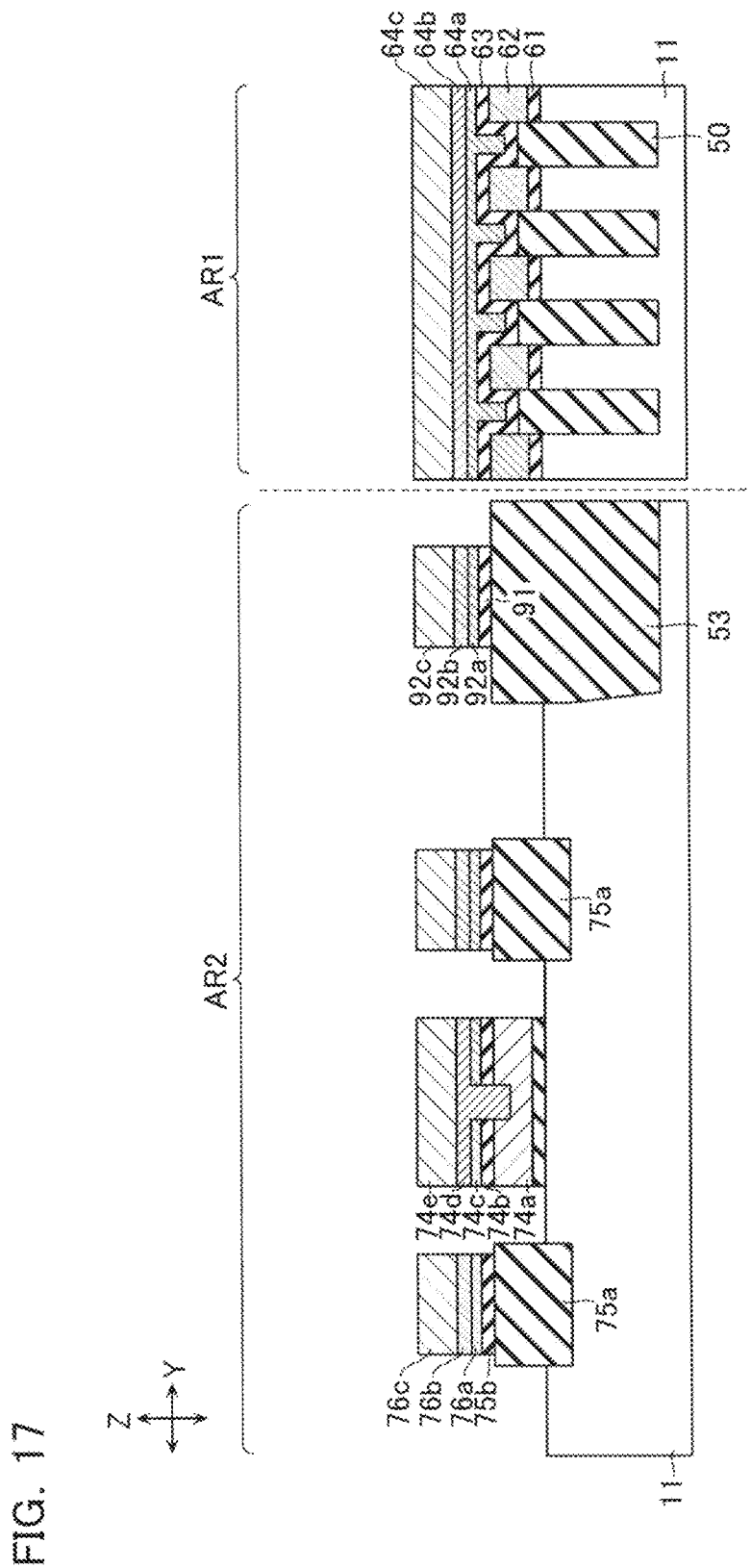
FIG. 17 is a cross-sectional view showing the manufacturing method of the transfer transistor QN and the memory cell MC according to the third embodiment.

Next, as shown in FIG. 17, the layers 201~209 in the areas AR1 and AR2 are processed. This results in the following. In the area AR2, the insulating layer 201 becomes the gate insulating layer 73 shown in FIG. 9. In the area AR2, the polysilicon layer 202 becomes the gate electrode layer 74a shown in FIG. 9. In the area AR2, a part of the insulating layer 206 becomes the electrode insulating layer 74b shown in FIG. 9, and another part of the insulating layer 206 becomes the insulating layers 75b and 91 shown in FIG. 9. In the area AR2, a part of the polysilicon layer 207 becomes the gate electrode layer 74c shown in FIG. 9, and another part of the polysilicon layer 207 becomes the block conductive layer 76a and the shield conductive layer 92a shown in FIG. 9. In the area AR2, a part of the polysilicon layer 208 becomes the gate electrode layer 74d shown in FIG. 9, and another part of the polysilicon layer 208 becomes the block conductive layer 76b and the shield conductive layer 92b shown in FIG. 9. In the area AR2, a part of the metal layer 209 becomes the gate electrode layer 74e shown in FIG. 9, and another part of the metal layer 209 becomes the block conductive layer 76c and the shield conductive layer 92c shown in FIG. 9.

Moreover, the processing shown in FIG. 17 results also in the following. In the area AR1, the insulating layer 206 becomes the memory gate insulating layer 63 shown in FIG. 9. In the area AR1, the polysilicon layers 206 and 207 become the gate electrode layers 64a and 64b, and the metal layer 209 becomes the gate electrode layer 64c.

After the processing shown in FIG. 17, impurity ions are implanted in the P type semiconductor substrate 11 in the area AR2 to form the drain diffusion region 71 and the source diffusion region 72. Next, the inter-layer insulating layer 65 is formed to fill in the stacking structure of the transfer transistor QN. Then, the contact plugs 81a and 81b and the upper layer wiring line 20 are formed to complete the structure shown in FIG. 9.

[Fourth Embodiment]

Figure 18:
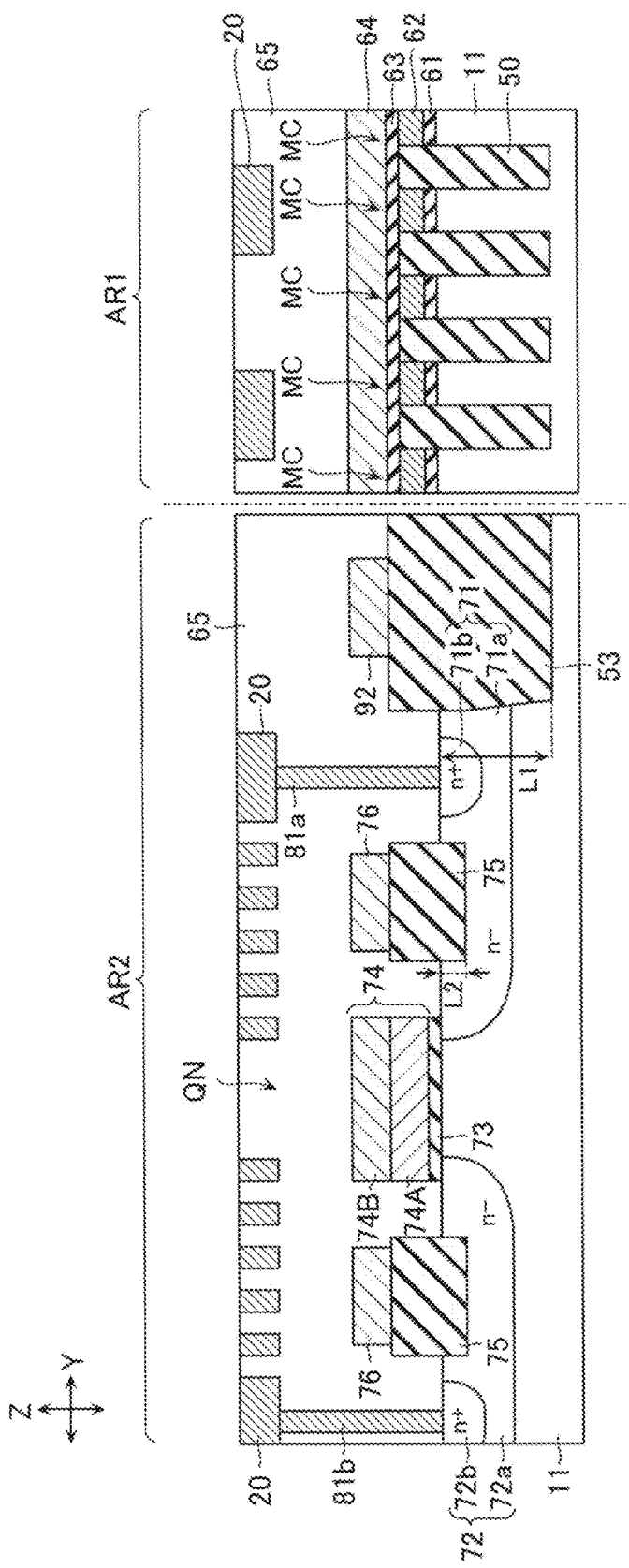
FIG. 18 is an example of a cross-sectional view of a transfer transistor QN and a memory cell MC according to a fourth embodiment.

Next, a nonvolatile semiconductor memory device according to a fourth embodiment will be described with reference to FIG. 18. FIG. 18 is an example of a cross-sectional view of a memory area AR1 (memory cell MC) and a decoder area AR2 (transfer transistor QN) according to the fourth embodiment. The fourth embodiment has a circuit configuration similar to that of the first embodiment. On the other hand, as shown in FIG. 18, the fourth embodiment has stacking structures of the memory area AR1 (memory cell MC) and the decoder area AR2 (transfer transistor QN) which are different to those of the first embodiment.

As shown in FIG. 18 and contrary to in the third embodiment, in the memory area AR1 (memory cell MC), the upper surface of the floating gate layer 62 is formed to align with the upper surface of the element isolation insulating layer 50. Moreover, the gate electrode layer is configured by a metal.

As shown in FIG. 18 and contrary to in the third embodiment, in the decoder area AR2 (transfer transistor QN), the gate electrode layer 74 is configured by gate electrode layers 74A and 74B that are stacked. An upper surface of the gate electrode layer 74A is formed to align with the upper surface of the block insulating layer 75. The gate electrode layer 74A is configured by polysilicon, and the gate electrode layer 74B is configured by a metal.

As shown in FIG. 18 and contrary to in the third embodiment, in the decoder area AR2 (transfer transistor QN), the block conductive layer 76 is formed in the same layer as the gate electrode layer 74B, and the upper surface of the block conductive layer 76 aligns with an upper surface of the gate electrode layer 74B. The block conductive layer 76 is configured by a metal.

In addition, as shown in FIG. 18 and contrary to in the third embodiment, the shield conductive layer 92 is formed in the same layer as the gate electrode layer 74B, and the upper surface of the shield conductive layer 92 aligns with the upper surface of the gate electrode layer 74B. Moreover, the shield conductive layer 92 is configured by a metal. Similar advantages to those of the third embodiment are displayed also by the above-described fourth embodiment.

[Fifth Embodiment]

Figure 19:
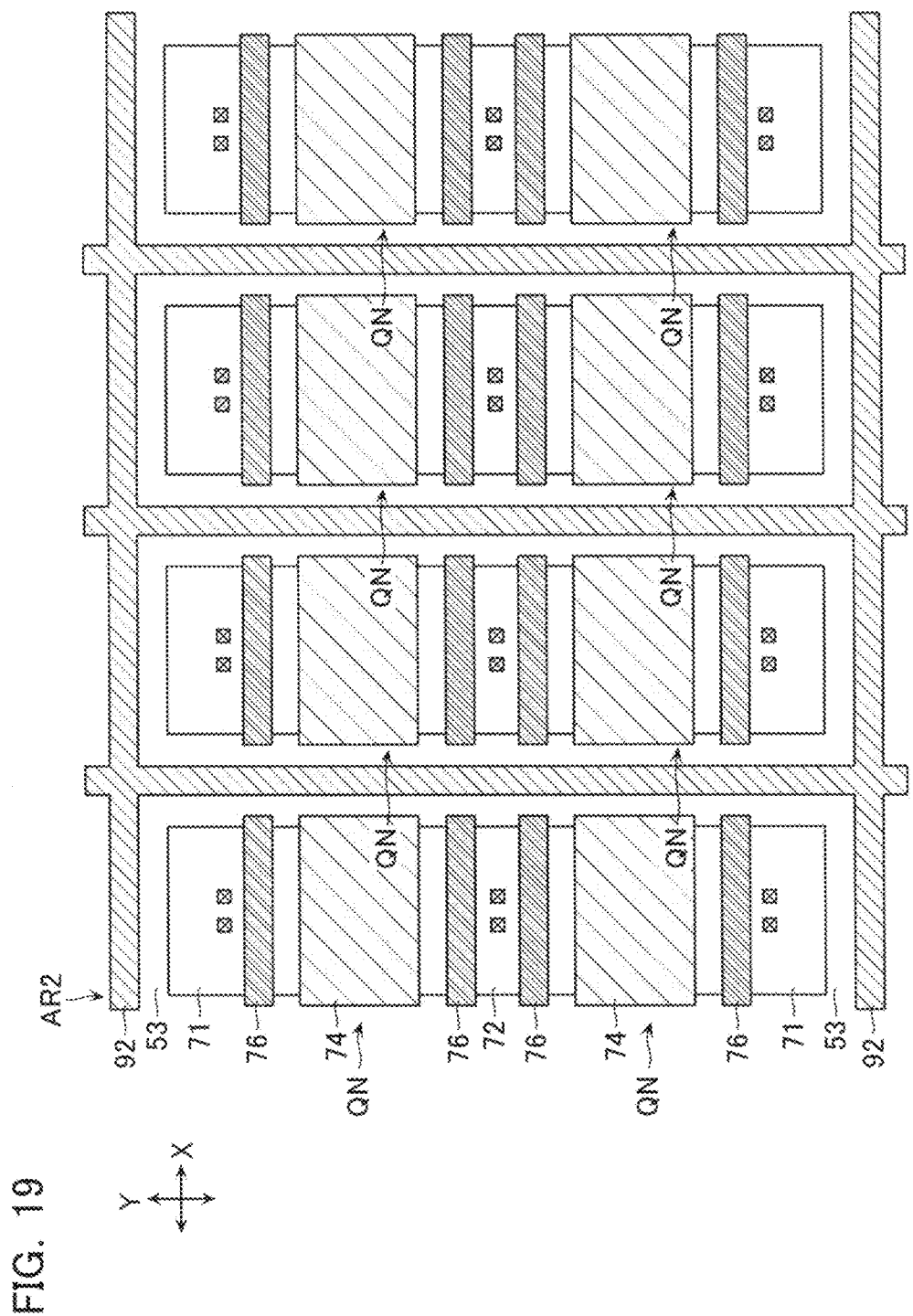
FIG. 19 is an example of a top view showing a transfer transistor QN in a decoder area AR2 according to a fifth embodiment.

Next, a nonvolatile semiconductor memory device according to a fifth embodiment will be described with reference to FIG. 19. FIG. 19 is an example of a top view showing a decoder area AR2 (transfer transistor QN) according to the fifth embodiment. The fifth embodiment has a circuit configuration similar to that of the first embodiment. Moreover, the fifth embodiment has a stacking structure similar to that of the third embodiment. However, as shown in FIG. 19, the fifth embodiment has shapes of the block conductive layer 76 and the shield conductive layer 92 as viewed from the Z direction which are different to those of the third embodiment.

As shown in FIG. 19, in the fifth embodiment, the block conductive layer 76 extends in the X direction. However, the block conductive layers 76 are each divided on a transfer transistor QN basis. That is, a pair of the block conductive layers 76 are provided for each transfer transistor QN. The shield conductive layer 92 is formed in a grid as viewed from the Z direction. Similar advantages to those of the third embodiment are displayed also by such a fifth embodiment.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 20:
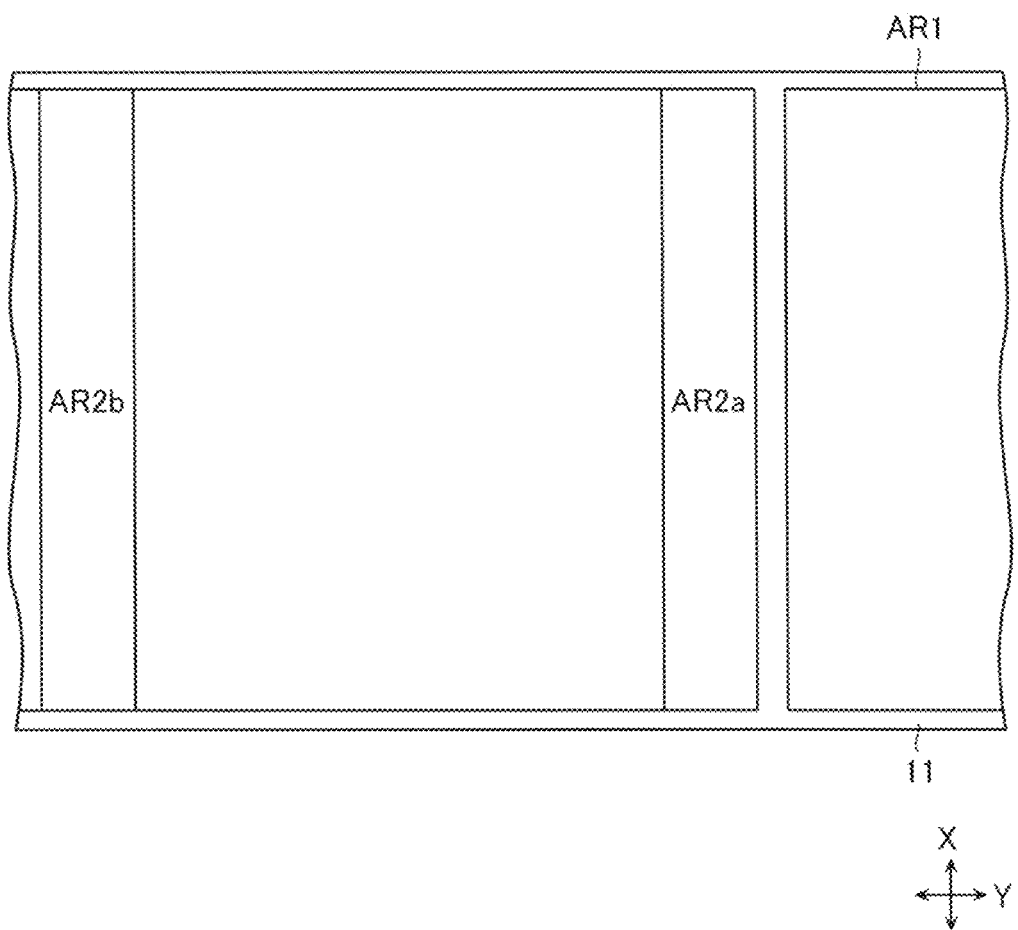
FIG. 20 is a top view showing a memory area AR1 and a decoder area AR2 (AR2a and AR2b) according to another embodiment.
Figure 21:
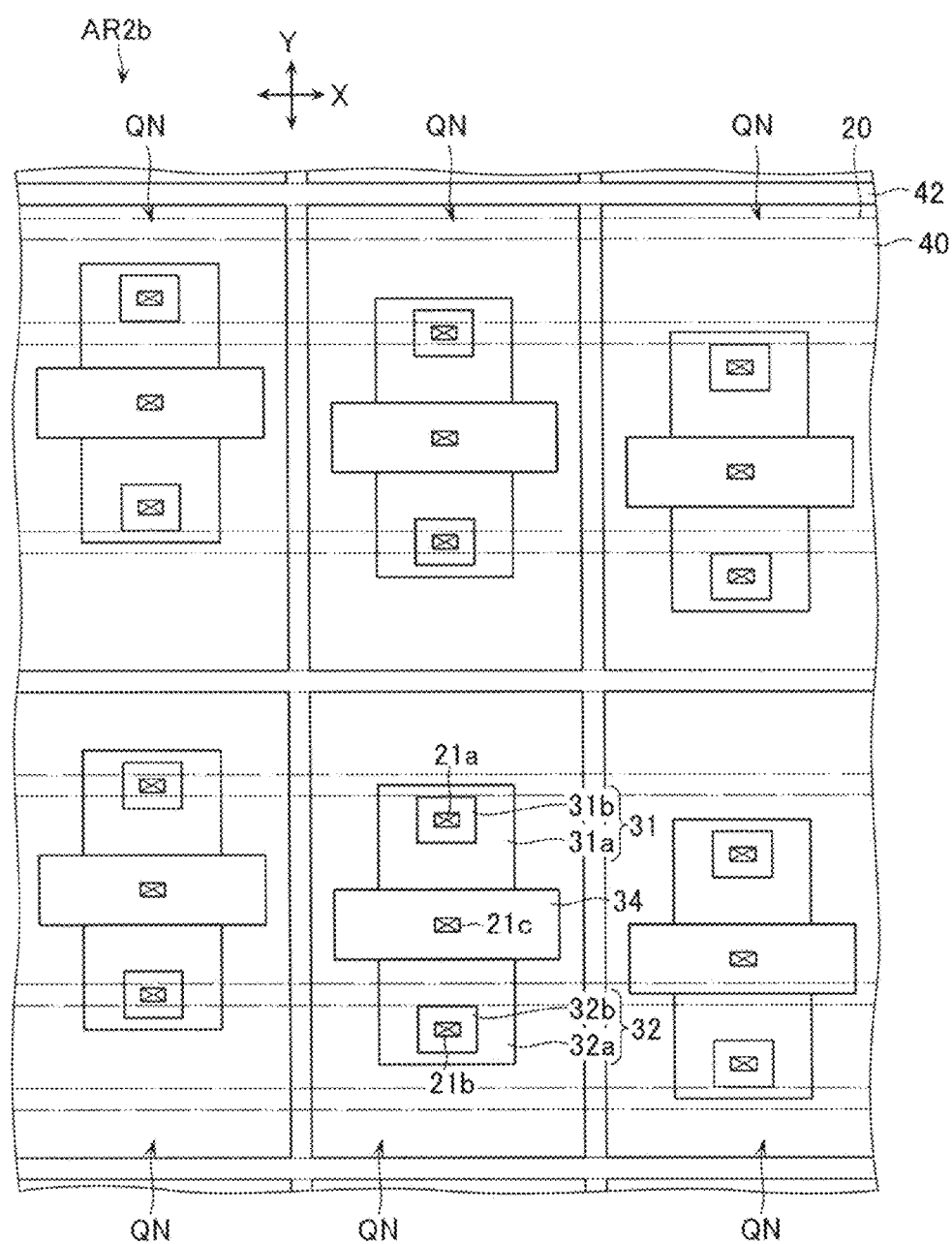
FIG. 21 is an example of a top view showing a transfer transistor QN in a decoder area AR2b according to another embodiment.

For example, as shown in FIG. 20, there may be different stacking structures of the transfer transistor QN in a decoder area AR2a and a decoder area AR2b which is more distant from the memory area AR1 than is the decoder area Ar2a. The transfer transistor QN in the decoder area AR2a has a stacking structure similar to those of the above-described first and second embodiments (refer to FIGS. 3~7). On the other hand, as shown in FIG. 21 and contrary to in the first and second embodiments, the gate electrode layer 34 in the decoder area AR2b is formed in a rectangular shape only directly above the P type semiconductor substrate 11 sandwiched by the drain diffusion region 31 and the source diffusion region 32. Now, the number of upper layer wiring lines 20 in the decoder area AR2b is less than the number of upper layer wiring lines 20 in the decoder area AR1b as shown in FIG. 21. Therefore, the resistance value of the n– type drain diffusion region 31a and the n– type source diffusion region 32a does not change due to a potential of the upper layer wiring line 20, even if the gate electrode layer 34 in the decoder area AR2b has the shape shown in FIG. 21.

Figure 22:
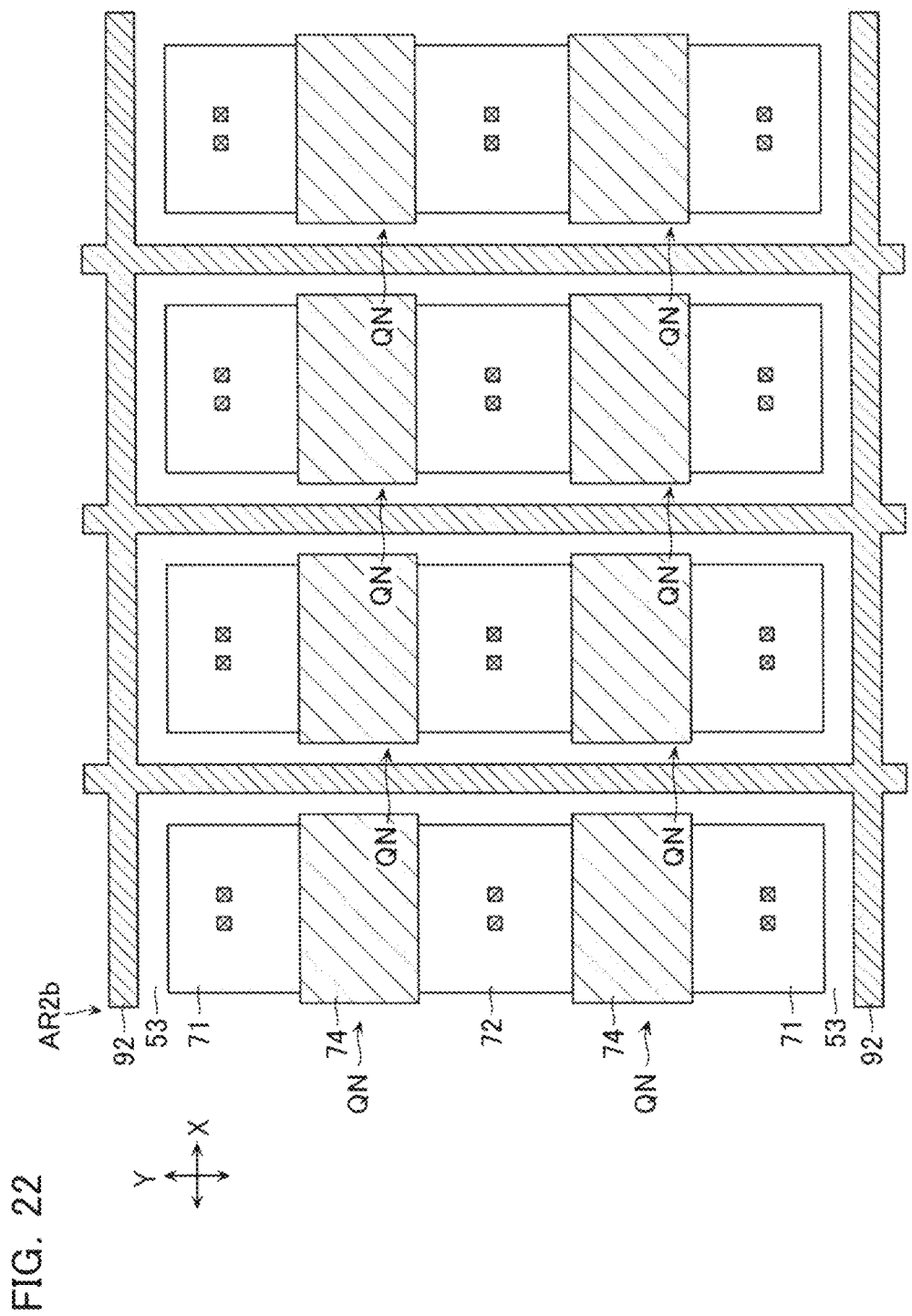
FIG. 22 is an example of a top view showing a transfer transistor QN in a decoder area AR2b according to another embodiment.

Moreover, as shown in FIG. 22, the transfer transistor QN in the decoder area AR2b may have a stacking structure omitting the block conductive layer 76 from the configuration of the fifth embodiment.

What is claimed is:

1. A nonvolatile semiconductor memory device, comprising:
    a memory cell array configured as an arrangement of memory cells, each memory cell holding data in a nonvolatile manner; and
    a transfer transistor configured to transfer a certain voltage to a gate of the memory cell,
    the transfer transistor comprising:
        a pair of first diffusion regions formed in a surface of a semiconductor substrate, and each connected to a contact; and
        a gate electrode layer formed on the semiconductor substrate via a gate insulating layer and having a pair of openings each surrounding one of the contacts,
        the opening being independent from each other.

2. The nonvolatile semiconductor memory device according to claim 1, wherein
    the pair of first diffusion regions each comprises:
    a second diffusion region formed below the gate electrode layer and having a first impurity concentration; and
    a third diffusion region formed below the openings and having a second impurity concentration which is higher than the first impurity concentration.

3. The nonvolatile semiconductor memory device according to claim 1, further comprising
    an element isolation insulating layer formed in the semiconductor substrate and surrounding the transfer transistor, and
    a shield conductive layer formed on the element isolation insulating layer.

4. The nonvolatile semiconductor memory device according to claim 3, wherein
    the element isolation insulating layer is formed in a grid on the semiconductor substrate, and divide the transfer transistors, and
    the shield conductive layer is formed in a grid on the element isolation insulating layer.

5. The nonvolatile semiconductor memory device according to claim 3, wherein
an upper surface of the gate electrode layer and an upper surface of the shield conductive layer are substantially the same height.

6. The nonvolatile semiconductor memory device according to claim 1, further comprising
an element isolation insulating layer formed in the semiconductor substrate and surrounding the transfer transistor, wherein
the gate electrode layer is extended onto the element isolation insulating layer, and entire outer edge of the gate electrode layer is above the element isolation insulating layer.

7. The nonvolatile semiconductor memory device according to claim 1, further comprising a plurality of wiring lines formed above the transfer transistor,
wherein the plurality of wiring lines are extended in a gate width direction of the transfer transistor.

8. The nonvolatile semiconductor memory device according to claim 1, further comprising a plurality of wiring lines formed above the transfer transistor,
wherein one of the plurality of wiring lines is connected to the gate electrode layer.

9. The nonvolatile semiconductor memory device according to claim 1, further comprising a plurality of wiring lines formed above the transfer transistor,
wherein two of the plurality of wiring lines are each connected to the contact.

\* \* \* \* \*